(12) United States Patent
Shinriki et al.

(10) Patent No.: US 7,435,484 B2
(45) Date of Patent: Oct. 14, 2008

(54) RUTHENIUM THIN FILM-FORMED STRUCTURE

(75) Inventors: Hiroshi Shinriki, Tama (JP); Hiroaki Inoue, Tama (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 11/469,828

(22) Filed: Sep. 1, 2006

(65) Prior Publication Data

US 2008/0054472 A1 Mar. 6, 2008

(51) Int. Cl.
*B32B 15/01* (2006.01)
*B32B 15/04* (2006.01)
*B32B 15/20* (2006.01)

(52) U.S. Cl. ................... 428/670; 428/336; 428/674

(58) Field of Classification Search .............. 428/607, 428/670, 656, 669, 674, 680, 650, 679, 214, 428/215, 216, 332, 333, 336, 338, 457
See application file for complete search history.

(56) References Cited

U.S. PATENT DOCUMENTS

| | | | |
|---|---|---|---|
| 5,884,009 | A | 3/1999 | Okase |
| 6,482,733 | B2 | 11/2002 | Raaijmakers et al. |
| 6,482,740 | B2 | 11/2002 | Soininen et al. |
| 6,759,325 | B2 | 7/2004 | Raaijmakers et al. |
| 2005/0098440 | A1 * | 5/2005 | Kailasam et al. ............ 205/183 |
| 2005/0124154 | A1 | 6/2005 | Park et al. |
| 2005/0229848 | A1 | 10/2005 | Shinriki et al. |
| 2006/0137608 | A1 | 6/2006 | Choi et al. |
| 2006/0177601 | A1 | 8/2006 | Park et al. |
| 2007/0190782 | A1 | 8/2007 | Park |

FOREIGN PATENT DOCUMENTS

| | | | |
|---|---|---|---|
| EP | 1 688 923 A2 * | 8/2006 | |
| JP | 2003-168738 A | 6/2003 | |
| WO | WO 03/056612 A1 | 7/2003 | |

OTHER PUBLICATIONS

U.S. Appl. No. 11/367,177, filed Mar. 3, 2006, Hiroshi Shinriki, et al.
Growth and characterization of atomic layer deposited $WC_{0.7}N_{0.3}$ on polymer films, Journal of Applied Physics, vol. 95, No. 1 pp. 381-388, Jan. 1, 2004.
C.C. Yang, "Physical, Electrical, and Reliability Characterization of Ru and Cu Interconnects," IITC 2006, pp. 187-189, no month.
U.S. Appl. No. 10/728,126, filed Dec. 3, 2003, Ernst H.A. Granneman.
U.S. Appl. No. 10/782,727, filed Feb. 18, 2004, Lindfors, et al.
U.S. Appl. No. 11/557,891, filed Nov. 8, 2006, Shinriki, et al.

* cited by examiner

*Primary Examiner*—Michael La Villa
(74) *Attorney, Agent, or Firm*—Knobbe, Martens, Olson & Bear LLP

(57) ABSTRACT

A method of depositing a ruthenium(Ru) thin film on a substrate in a reaction chamber, includes: (i) supplying a gas of a ruthenium precursor into the reaction chamber so that the gas of the ruthenium precursor is adsorbed onto the substrate, wherein the ruthenium precursor a ruthenium complex contains a non-cyclic dienyl; (ii) supplying an excited reducing gas into the reaction chamber to activate the ruthenium precursor adsorbed onto the substrate; and (iii) repeating steps (i) and (ii), thereby forming a ruthenium thin film on the substrate.

11 Claims, 12 Drawing Sheets

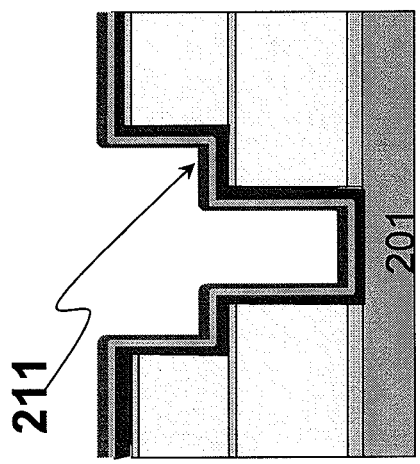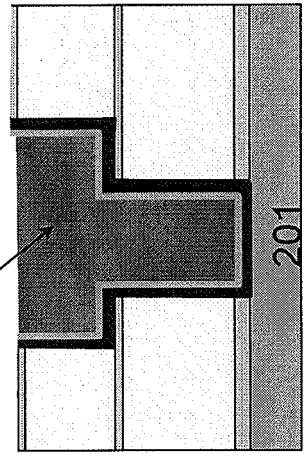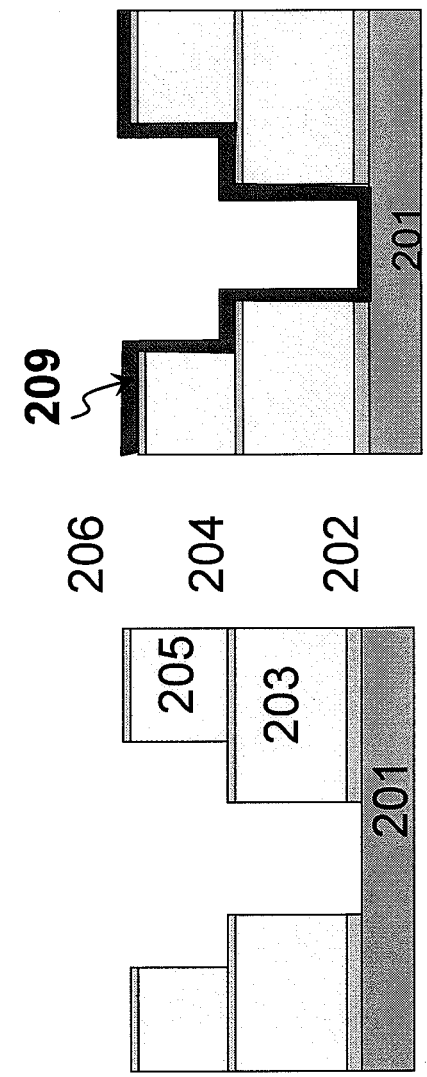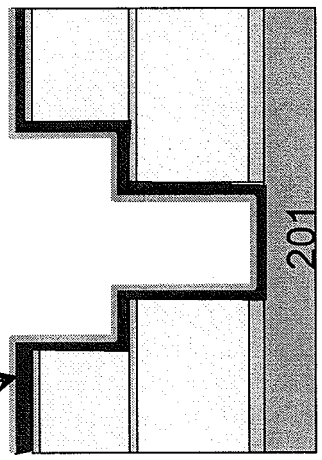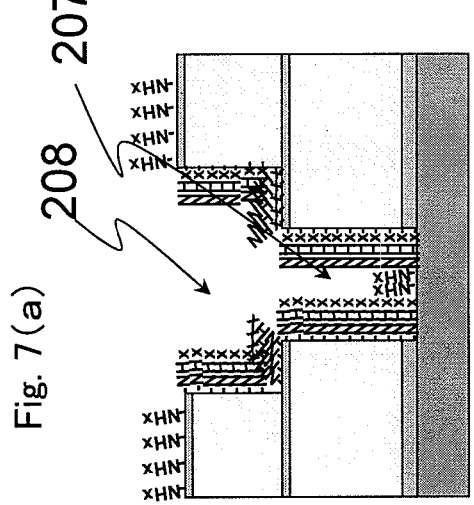

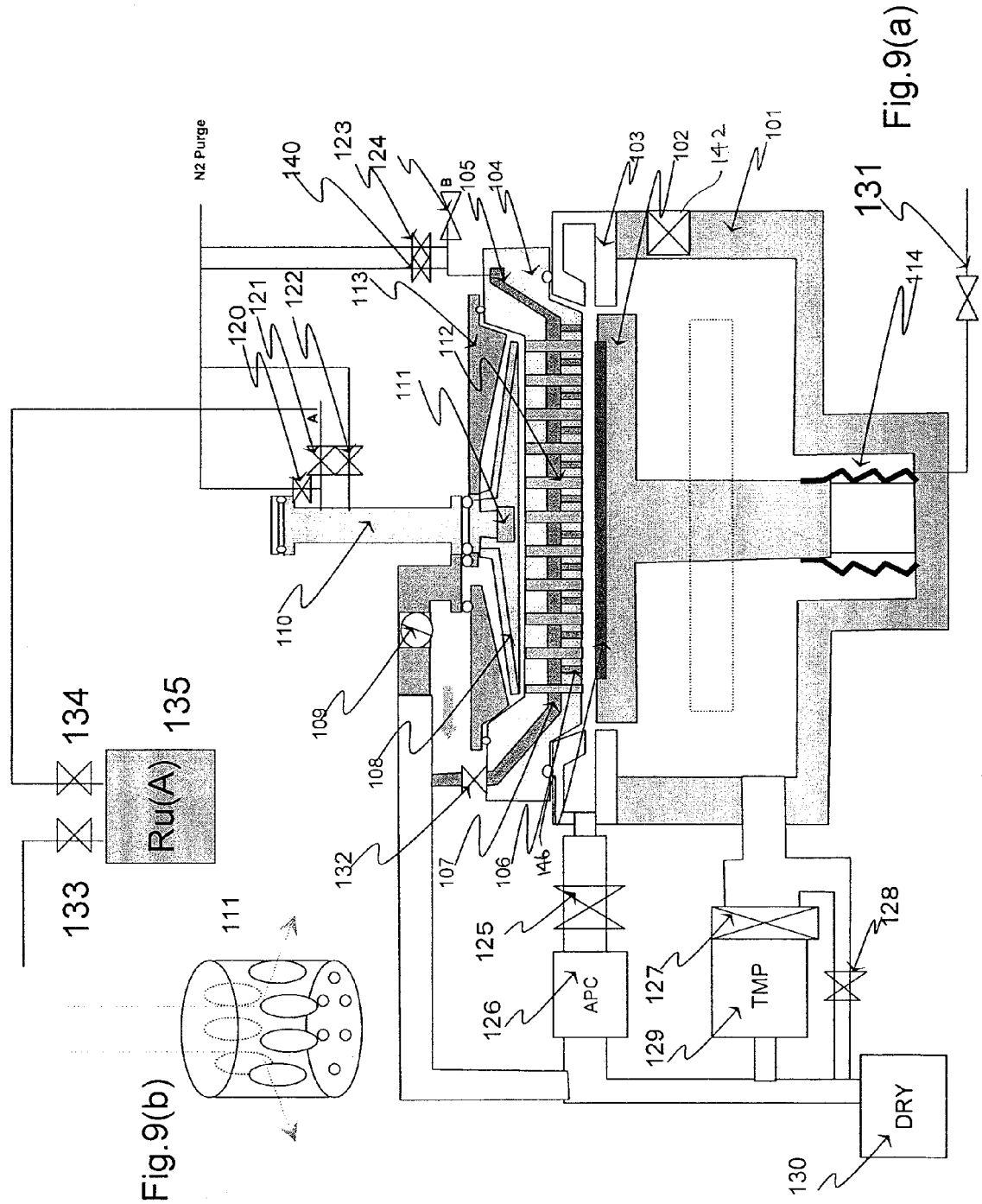

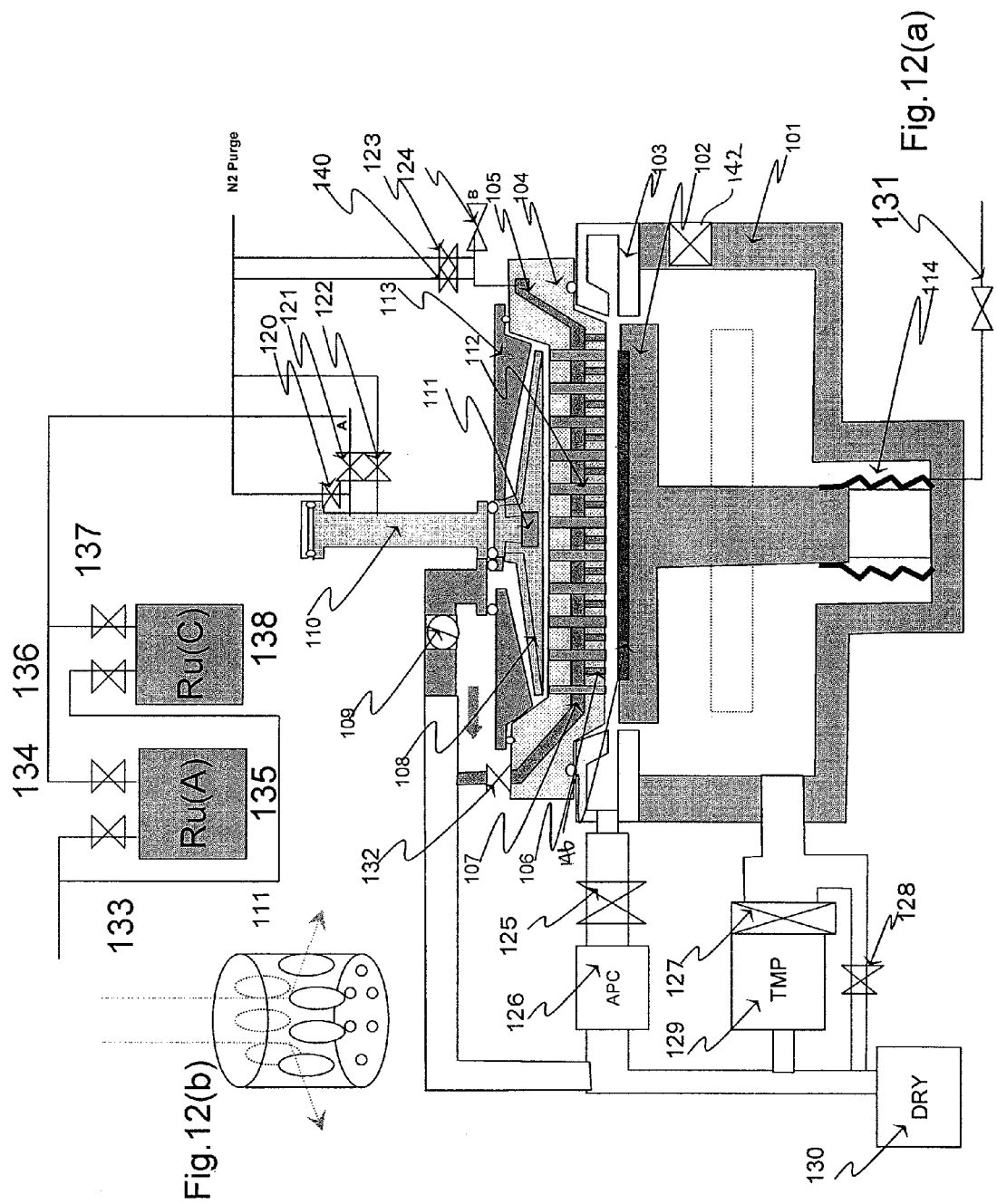

RUTHENIUM THIN FILM-FORMED STRUCTURE

BACKGROUND OF THE INVENTION

1. Field of the Invention

The present invention generally relates to a method of forming ruthenium (Ru) films for metal wring structures that can be used favorably in producing fine semiconductor devices.

2. Description of the Related Art

Ru films are drawing the attention because by forming a Ru film at the interface of Cu and barrier metal in a Cu wiring structure, which is the mainstream wiring structure used with high-speed logic devices such as MPUs, the Ru film can provide improved adhesion with Cu and thus significantly improve the reliability of wiring. Methods to form a Ru film on a TaN film or WN film, which is a Cu diffusion barrier metal, and then form a Cu film on top of the Ru film, are being examined (refer to C-C Yong et al., IITC 2006, pp. 187-189, "Physical, Electrical, and Reliability Characterization of Ru for Cu Interconnects" for an example of such method on a Ru/TaN combination). Specifically, application of a Cu liner consisting of a layered structure of Ru/TaN, etc., is examined.

A Cu liner film, such as Ru/TaN, which is being examined for use as a Cu wiring liner, tends to produce higher Cu wiring resistance if the film is thicker, because a thicker film results in a smaller Cu wiring volume. This creates a need to make the film as thin as possible. In a layered structure consisting of a copper-diffusion barrier film and a Ru film, however, making the Ru film thinner virtually prevents formation of a continuous film, resulting in the barrier film being exposed partially. As a result, an interface of Cu wiring and barrier film is produced, which can cause problems. If the Ru film is made thicker to form a continuous film, on the other hand, the Cu wiring resistance increases. In other words, formation of a thin, continuous Ru film is desired. Also, when forming a Ru film on a copper-diffusion barrier film such as a TaN film, TaNC film, etc., the Ru film is required to be formed in a reducing atmosphere to prevent the aforementioned barrier film from being oxidized.

According to US2006/0177601A, a Ru film can be formed in a reducing atmosphere by means of a step to supply a Ru material that contains a ligand containing a cyclopentadienyl group, and a treatment step using NH3 gas activated by high-frequency waves.

SUMMARY OF THE INVENTION

Although a WNC film is an excellent copper-diffusion barrier film, forming a Ru/WNC layered structure makes the Ru film thin, thus making the film virtually non-continuous and therefore causing the WNC film to become partially exposed easily. The inventors utilized the process disclosed in US2006/0177601A to form a 3-nm Ru film on a WNC film, after which a copper seed layer was formed along with a plating layer, followed by a CMP process over the wiring. As a result, the underlying WNC film was etched because the Ru film was not continuous, and the Ru film peeled off. A Ru film does not easily become a continuous film unless the film has a certain thickness (approx. 3 to 4 nm).

In an embodiment, the present invention provides a method of depositing a ruthenium(Ru) thin film on a substrate in a reaction chamber, comprising: (i) supplying a gas of a ruthenium precursor into the reaction chamber so that the gas of the ruthenium precursor is adsorbed onto the substrate, said ruthenium precursor a ruthenium complex containing a non-cyclic dienyl; (ii) supplying an excited reducing gas into the reaction chamber to activate the ruthenium precursor adsorbed onto the substrate; and (iii) repeating steps (i) and (ii), thereby forming a ruthenium thin film on the substrate.

The above embodiment includes, but is not limited to, the following embodiments:

In embodiments, the ruthenium complex may have a structure of Xa-Ru-Xb, wherein at least one of Xa or Xb is a non-cyclic dienyl. The non-cyclic dienyl may be a non-cyclic pentadienyl. The non-cyclic pentadienyl may have at least one side chain of C1-2 alkyl. The non-cyclic pentadienyl may have two side chains of methyl.

In embodiments, Xa may be a non-cyclic dienyl, and Xb may be a cyclic dienyl. Xa may be a non-cyclic pentadienyl and Xb may be a cyclopentadienyl.

In other embodiments, Xa and Xb may be both non-cyclic pentadienyls.

In embodiments, the excited reducing gas may be generated by applying radio-frequency power to a reducing gas. The reducing gas may be ammonia, hydrogen, or a mixture of nitrogen and hydrogen. The excited reducing gas may be an ammonia or hydrogen plasma.

In embodiments, the method may further comprise purging the ruthenium precursor gas from the reaction chamber after step (i) and purging the excited reducing gas from the reaction chamber after step (ii).

In embodiments, steps (i) and (ii) may be repeated to form the ruthenium thin film having a thickness of no less than 0.5 nm but no more than 2.0 nm. Steps (i) and (ii) may also be repeated to form the ruthenium thin film having a thickness of no less than 0.5 nm but no more than 2.0 nm. Steps (i) and (ii) may still be repeated 50 times to 150 times.

In embodiments, the method may further comprise providing a metal film before steps (i)-(iii) begin wherein the ruthenium thin film is formed on the metal film. The metal film may be selected from the group consisting of WNC, WN, TaN, Ta, TaNC, TiN, Ti, Cu, Al, Co, and Ni.

In embodiments, in step (i), the gas of the ruthenium precursor may be a first gas, and step (i) may further comprise supplying a second gas of another ruthenium precursor into the reaction chamber simultaneously with the first gas.

In other embodiments, the method may further comprise after repeating steps (i) and (ii) a give number of times: (iv) supplying a second gas of another ruthenium precursor into the reaction chamber so that the second gas of the other ruthenium precursor is adsorbed onto the substrate; (v) supplying an excited reducing gas into the reaction chamber to activate the other ruthenium precursor adsorbed onto the substrate; and (vi) repeating steps (iv) and (v), thereby forming a ruthenium thin film on the substrate.

In embodiments, the method may further comprise after step (iii) forming a ruthenium thin film or ruthenium oxide thin film on the ruthenium thin film by CVD.

In embodiments, the method may further comprise after step (iii) forming a copper film on the ruthenium thin film. The copper film may be formed by supplying a gas of a copper precursor on the substrate, which is produced by CVD or ALD.

In another embodiment, the present invention provides a ruthenium thin film-formed structure comprising: a substrate; a ruthenium thin film formed on the substrate, which is continuous without pinholes and has a thickness of no less than 0.5 nm but no more than 2.0 nm.

All of the aforesaid embodiments can be employed in any combination.

The above embodiment further includes, but is not limited to, the following embodiments.

The ruthenium thin film may be formed with a ruthenium complex containing a non-cyclic dienyl. The substrate may have a metal film, and the ruthenium thin film may be formed on the metal film. The metal film may be selected from the group consisting of WNC, WN, TaN, Ta, TaNC, TiN, Ti, Cu, Al, Co, and Ni. The ruthenium thin film-formed structure may further comprise a copper film on the ruthenium thin film.

All of the aforesaid embodiments can be employed in any combination.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIGS. 7(a), (b), (c), (d), (e) and (f) provide a schematic diagram illustrating a process flow ((a)→(b)→(c)→(d)→(e)→(f)) of applying a Ru-film forming process conforming to an embodiment of the present invention to a dual-damascene Cu wiring process.

FIG. 8(a) is a diagram illustrating the dual-damascene Cu wiring process (pre-treatment→WNxCy film→Ru film forming) shown in FIG. 7 as used in an embodiment of the present invention, while

FIG. 9(a) is a schematic diagram illustrating one example of the structure of a reaction apparatus used to implement, in an embodiment of the present invention, the process comprising a step to form a Ru film on WNC, and a step to form a Ru film in an oxidizing atmosphere by means of CVD.

FIG. 9(b) is a schematic diagram illustrating one example of a gas dispersion nozzle that can be used in the apparatus shown in FIG. 9(a).

FIG. 12(a) is a schematic diagram illustrating one example of the structure of a forming apparatus that can be used in an embodiment of the present invention, wherein the material used to form an ALD-Ru film is different from the material used to form a Ru film by CVD.

FIG. 12(b) is a schematic diagram illustrating one example of a gas dispersion nozzle that can be used in the apparatus shown in FIG. 12(a).

DESCRIPTION OF THE SYMBOLS

Figure 1B:
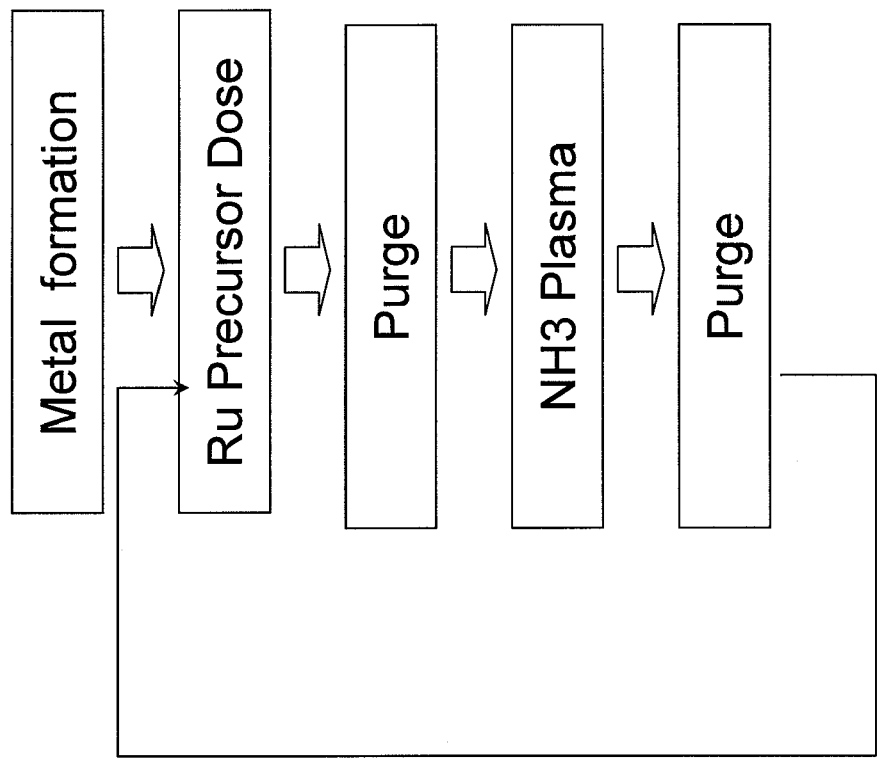
FIG. 1(b) is a diagram illustrating a process that is repeated to form a Ru film on a metal film, implemented in an embodiment of the present invention.

1: Chamber
2: Upper lid
3: Dispersion plate
4: Exhaust duct
5: Lower chamber
6: Substrate transfer gate
7: Exhaust port
8: Substrate heater
9: Substrate-heater up/down bellows
10: Gas introduction pipe
11: Gas introduction part
12: Radical source
13: Gas dispersion guide
14: Space between the gas dispersion part 13 and the dispersion plate 3
15: Substrate
16: Radical-source connection valve
17: Slit continuing from the gas dispersion guide to the exhaust port
18: Space continuing to the exhaust port
19: Connection flange for exhaust
20: Exhaust valve continuing into the showerhead
21: Gas discharge port provided on the dispersion plate 3
22: Space between the dispersion plate 3 and the substrate
23: Ring slit
24: Exhaust pipe continuing to the ring slit
25: High-frequency wave introduction terminal
26: Pressure control part
27: Molecular-pump gate valve
28: Evacuation gate valve
29: Molecular pump
30: Dry pump
31: Bellows-purge gas introduction valve
201: Lower-layer copper wiring
202: Copper-diffusion prevention layer
203: Interlayer insulation film 1
204: Etching stopper layer 205: Interlayer insulation film 2
206: Copper-diffusion prevention film
207: Via
208: Trench
209: WNxCy film
210: Ru-ALD film
211: Cu seed film
212: Copper wiring
300: Silicon-substrate introduction port
301: Silicon-substrate transfer unit
302: Load lock chamber
303: Vacuum transfer chamber
304: Pre-cleaning module
305: WNxCy forming module
306: Ru-ALD forming module
101: Chamber
102: Gate valve
103: Exhaust duct
104: Shower plate
105: Gas introduction port to the lower gas dispersion chamber
106: Gas discharge port from the lower gas dispersion chamber
107: Lower gas dispersion chamber
108: Gas guide for the upper gas dispersion chamber
109: Exhaust valve for the upper gas dispersion chamber
110: Center gas pipe for mixing gases
111: Gas dispersion plate
112: Gas discharge port from the upper gas dispersion chamber
113: Upper lid plate
114: Substrate-heating table up/down bellows
115: Substrate
120: Ru material-gas purge valve
121: Ru material-gas introduction valve
122: Gas for purging the center gas pipe for mixing gases
123: Material-gas (NH3 or O2) purge gas valve
124: Material-gas (NH3 or O2) introduction valve
125: Exhaust-side main valve
126: Pressure control part
127: Molecular-pump gate valve
128: Evacuation gate valve
129: Molecular pump
130: Dry pump
131: Bellows-purge gas introduction valve
132: Exhaust valve continuing to the dispersion chamber 7
133: Carrier-gas introduction valve to the Ru (Precursor A) material container
134: Ru-material supply valve from the Ru (Precursor A) material container
135: Ru (Precursor A) material container
136: Carrier-gas introduction valve to the Ru (Precursor C) material container
137: Ru-material supply valve to the Ru (Precursor C) material container
138: Ru (Precursor C) material container

DETAILED DESCRIPTION OF THE PREFERRED EMBODIMENT

The present invention will be explained with reference to preferred embodiments and drawings. However, the preferred embodiments and drawings are not intended to limit the present invention.

An embodiment of the present invention is characterized by a method of forming Ru film, comprising a step to supply onto a substrate a Ru material gas selected from molecules having a Ru(XaXb) structure, wherein at least one of Xa or Xb is a non-cyclic dienyl, and a step to treat the substrate using a reducing gas excited by high-frequency waves. This embodiment is also characterized by a Ru film formed by means of the aforementioned forming method. A non-cyclic dienyl (also referred to as "linear dienyl") may have a 5-member, 6-member, 7-member or 8-member chain, among others, but in an embodiment a 5-member non-cyclic pentadienyl can be used favorably. This non-cyclic dienyl may have a side chain with a carbon number of 1 or above (preferably 2 or less) bonded to it.

In an embodiment, the aforementioned pentadienyl group in the Ru material having a Ru(XaXb) molecular structure wherein at least one of Xa or Xb is a non-cyclic pentadienyl (also simply referred to as "pentadienyl") may have a side chain with a carbon number of 1 or above bonded to it. The materials shown in FIGS. 2(a) and (b) both have a two-methyl-group side chain attached to the pentadienyl group. In addition to this side chain, the ethyl or butyl group may also be bonded, for example. Preferably, any hydrocarbon side chain bonded to the pentadienyl group has a carbon number of 2 or less. Also, the number of bonded side chains is 1 to 4, or preferably 2 or less. A pentadienyl group structure without side chain is also acceptable.

In an embodiment, the pentadienyl is either 1,3-pentadienyl or 1,4-pentadienyl.

In US2006/0177601A1, the structure is limited to one having a cyclopentadienyl group only, and use of any other Ru compound is prohibited. This is because the cyclopentadienyl group is chemically very stable and easy to handle. The inventor found that it is difficult to form a continuous film with a very small thickness in some cases (such as when the film is formed on a WNC film) using a Ru material having a cyclic cyclopentadienyl (such as cyclopentadienyl (Cp), methylcyclopentadienyl (MeCp), ethylcyclopentadienyl (EtCp) or iso-propylcyclopentadienyl (i-PrCp)). In an embodiment of the present invention, however, a very thin (1 nm or less) but continuous film can be formed using a Ru compound having a non-cyclic dienyl group. It is an astonishing discovery that combining such Ru material with reducing NH3 plasma allows for formation of a dramatically thin continuous film. For example, while using a Ru material having a cyclopentadienyl only requires a thickness of 3 to 4 nm in order to form a continuous film, in an embodiment use of a Ru material having a pentadienyl forms a continuous film with a thickness of only around 0.6 nm. This technology to form a continuous thin Ru film has significant impact on resistance reduction and reliability improvement of wiring to help create finer copper wiring for future semiconductor devices, and combination of the aforementioned material with NH3 plasma allows for dramatic quality improvement of semiconductor devices. Cyclopentadienyl complexes are easy to synthesize, and thus affordable, and they are also structurally stable. These features make cyclopentadienyl complexes suitable for industrial production applications. Although they can form a favorable ALD (atomic layer deposition) film in general, problems occur if the film thickness is reduced further.

Figure 1A:
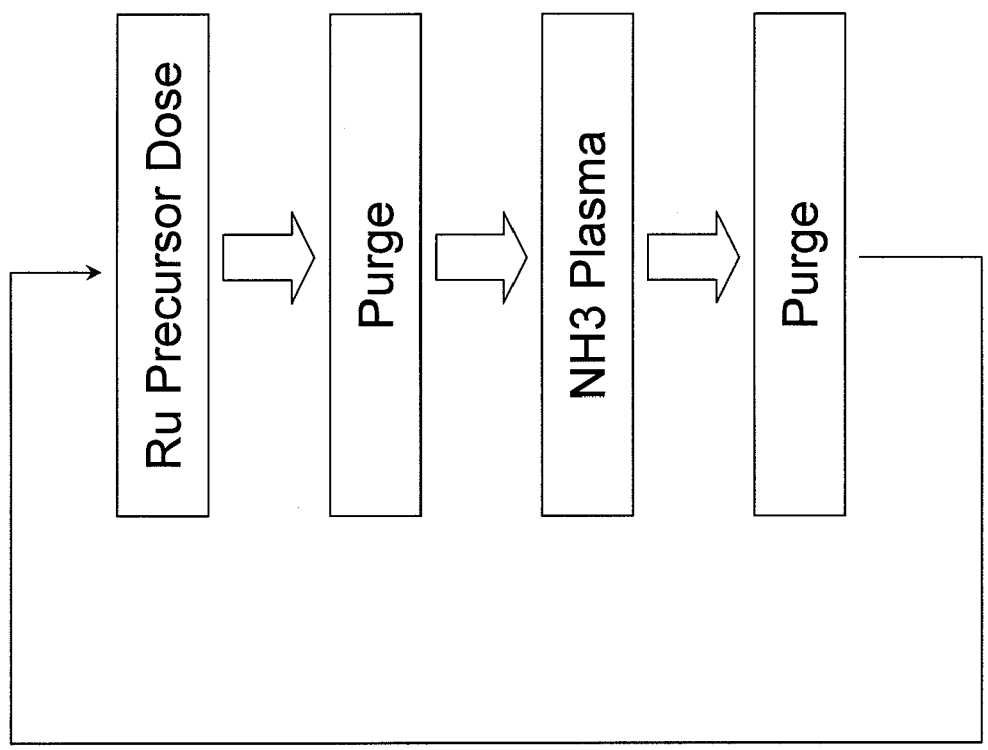
FIG. 1(a) is a diagram illustrating a process that is repeated to form a Ru film, implemented in an embodiment of the present invention.

FIG. 1(a) shows the basic process in an embodiment. First, a Ru material gas is supplied onto a substrate. At this time, the Ru material is heated to a temperature range of approx. 80 to 120° C. (including 90° C., 100° C., 110° C. and other temperatures between the foregoing), and the generated vapor of the Ru material is introduced into a reaction apparatus by means of an inactive gas (such as Ar). The flow rate of the inactive gas may be in a range of approx. 100 to 700 sccm (including 200 sccm, 300 sccm, 400 sccm, 500 sccm, 600 sccm and other flow rates between the foregoing, or preferably between 300 and 500 sccm). To achieve an optimal vapor pressure of the Ru material, the vapor pressure may be adjusted desirably to a range of approx. 0.1 to 2 torr (including 0.5 torr, 1.0 torr, 1.5 torr and other pressures between the foregoing). In this embodiment, the flow rate of vaporized Ru refers to the flow rate of the carrier gas (inactive gas) containing Ru, which is used to carry the Ru material vapor produced by vaporizing the material at the above vapor pressure. Also, the supply pipe may be heated desirably to a temperature of 130° C. or above, such as 150° C. or so, to prevent the vaporized material from liquefying. Take note that the ALD process is a self-saturating process, and an ALD film can be formed on a substrate under the above conditions.

Next, in an embodiment the above gas is purged (using an inactive gas at a flow rate of 1,000 to 3,000 sccm), after which a reducing gas is excited using high-frequency waves to treat the Ru film surface. As the conditions to do this, NH3 gas can be supplied at a flow rate in a range of 200 to 700 sccm (or preferably 300 to 500 sccm), at a high-frequency output in a range of 200 to 1,000 W (including 300 W, 500 W, 700 W and other outputs between the foregoing) based on high-frequency waves of 13.56 kHz. As for the inactive gas, desirably Ar may be supplied desirably at a flow rate in a range of 300 to 2,000 sccm (or preferably 500 to 1,200 sccm). The pressure condition can be adjusted to an optimal level between 1 and 3 torr. In an embodiment, the aforementioned reducing gas may be NH3, H2, a mixture of N2 and H2, or a mixture gas containing any of the foregoing.

In an embodiment, a step to supply the aforementioned Ru material gas to a substrate, and a step to treat the aforementioned substrate using a reducing gas excited by high-frequency waves, are repeated to form a Ru film with a thickness of no less than 0.5 nm but no more than 2.0 nm, or preferably no less than 0.7 nm but no more than 1.2 nm.

In an embodiment, a step to supply the aforementioned Ru material gas to a substrate, and a step to treat the top surface of the aforementioned substrate using a gas containing at least NH3 or H2 excited by high-frequency waves, are repeated for no less than 50 cycles but no more than 150 cycles, or preferably no less than 75 cycles but no more than 100 cycles, to form the aforementioned Ru film. In other words, a film with a thickness of no less than 0.5 nm but no more than 2.0 nm can be formed by repeating the above steps for no less than 50 cycles but no more than 150 cycles.

In an embodiment, the aforementioned Ru film is formed on a metal film, as described in FIG. 1(b). The aforementioned metal film may be made of WNC, WN, TaN, Ta, TaNC, TiN, Ti, Cu, Al, Co or Ni.

Next, in an embodiment of the present invention a Ru material gas different from the aforementioned Ru material gas can be supplied simultaneously onto a substrate. This different material may have the material shown in FIG. 2(c) (i.e., (Ru(EtCp)2) mixed with it. The mixing ratio may be such that the different material accounts for approx. 50 to 95% (by flow rate). In other words, in an embodiment a Ru complex containing at least one non-cyclic dienyl group may be used for 5% or more (including 10%, 30%, 50%, 80%, 100% and other percentages between the foregoing), with a different material (particularly a Ru complex containing only a cyclic dienyl group) accounting for the remainder. For example, the aforementioned different material may be used for 50% or more. One advantage of supplying different materials simultaneously is that while a material containing a pentadienyl group can be easily broken down with NH3 plasma to form a Ru core, once a Ru core has been formed the adsorption of Ru(EtCp)2 is promoted and thus Ru formation can be promoted with the different material alone. There is also an economic advantage, in that the use of Ru(EtCp)2 that can be produced inexpensively allows for formation of a Ru film at lower cost.

In an embodiment, a step to supply the aforementioned Ru material gas (one cycle of this step consists of supply of the Ru material, purge, NH3 plasma treatment, and purge) is repeated for a specified number of cycles (such as 10 cycles, 20 cycles, 30 cycles, 40 cycles, 50 cycles and other cycles between the foregoing), after which a step to supply a different Ru material gas (such as a Ru complex containing only a cyclic dienyl group like Ru(EtCp)2) (one cycle of this step consists of supply of the different Ru material, purge, NH3 plasma treatment, and purge) is repeated for a specified number of cycles (such as the remaining 90 cycles, 80 cycles, 70 cycles, 60 cycles, 50 cycles and other cycles between the foregoing, if a total of 100 cycles are to be repeated together with the preceding step). In this case, advantages similar to those described above can also be achieved.

In an embodiment, a Ru film or Ru oxide film may be layered over the aforementioned Ru film already formed, via chemical vapor deposition (CVD) using an arbitrary Ru material and oxygen gas. Whether a Ru film or Ru oxide film is formed by CVD depends on the partial pressure of oxygen, where a low partial oxygen pressure forms a Ru film, while a high partial oxygen pressure forms a RuOx film. Here, either a Ru film or RuOx film may be formed in accordance with the purpose. However, the underlying barrier film is not oxidized due to the presence underneath of the Ru film formed by plasma ALD. One drawback of plasma atomic layer deposition, or atomic layer deposition, is that a slow growth process reduces productivity when a thick film is formed. On the other hand, chemical vapor deposition promotes quick growth and therefore permits formation of a thick film over a short period of time. In other words, a Ru film can be formed efficiently by forming an underlying Ru film of approx. 1 to 2 nm via plasma ALD, and then forming a thicker film in a chemical vapor deposition process. For example, it would be effective to form a Ru film or RuOx film of approx. 10 to 20 nm by CVD. Although the film growth speed with CVD is 10 to 100 times the film growth speed attained with ALD, CVD needs oxygen gas and also requires an ALD Ru film to be formed underneath using a reducing gas.

In an embodiment of the aforementioned CVD, oxygen gas is supplied at a flow rate of 20 to 100 sccm, a Ru material is heated to a temperature range of 80 to 100° C., and an inactive gas (such as Ar gas) is supplied at a flow rate of approx. 300 to 500 sccm into the reaction apparatus. Ar gas can also be supplied at a flow rate of 900 to 1,200 sccm. The substrate may be kept desirably at a temperature in a range of 300 to 400° C., to form a film under a pressure of 1 to 3 torr.

In an embodiment, a copper film may be formed on the aforementioned Ru film. The copper film can be formed on the aforementioned Ru film by means of a chemical vapor deposition or atomic layer deposition method, by supplying a copper material molecule into vacuum in gaseous form. This copper film can be formed using Cu(hfac)(tmvs) ((trimethylvinylsilyl)(hexafluoroacetylacetonat)) as the material, and by adjusting the substrate temperature to a range of 90 to 200° C. An inactive gas may be introduced as a carrier gas at a flow rate of 300 to 500 sccm. Cu(hfac)(tmvs) may be supplied desirably at a speed of approx. 50 to 200 mg/min. Vaporization can be caused using a general vaporizer at a temperature in a range of approx. 60 to 80° C., and the vaporized copper material is supplied to the reaction apparatus. The film forming pressure may be adjusted desirably to a range of 1 to 2 torr.

In the present disclosure where conditions and/or structures are not specified, the skilled artisan in the art can readily provide such conditions and/or structures, in view of the present disclosure, as a matter of routine experimentation. For the purposes, the disclosure of U.S. Publication No. 2006/0177601A1 is incorporated herein by reference in its entirety. Also, the disclosure of U.S. patent application Ser. No. 11/367,177 owned by the same assignee as in the present application is incorporated herein by reference in its entirety.

The present invention will be explained in detail with reference to the drawings. However, the drawings are not intended to limit the present invention.

As explained above, in an embodiment of the present invention a Ru-film forming process is implemented in a reducing atmosphere so that a Ru film can be formed on a barrier metal such as TaN or WNC, which acts as a Cu diffusion barrier, without oxidizing this barrier metal. As shown in FIG. 1(a), a Ru film can be formed in a reducing atmosphere by repeating a step to introduce a Ru precursor to the substrate surface; a step to purge the unnecessary Ru precursor; a step to treat the Ru precursor adsorbed to the substrate surface using a plasma gas generated by applying high-frequency waves to a reducing gas containing at least $NH_3$ or $H_2$, etc.; and a step to purge the reducing gas. This way, a Ru film can be formed without oxidizing the top surface of the Cu diffusion barrier made of TaN or WNC.

FIG. 1(b) shows a sequence of forming a Ru film on a metal film made of WNC or TaN, using a similar method. Evaluation focusing on the continuity of the Ru film on the metal film such as a WNC film, etc., finds that the film thickness needed to form a continuous film changes significantly in accordance with the structure of the Ru material molecule used to form a Ru film.

Figure 2C:
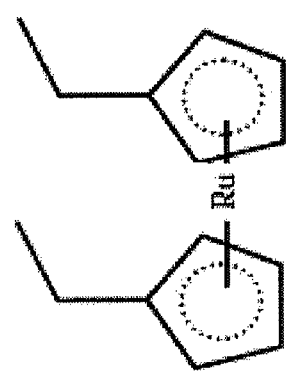
FIG. 2(c) is a chemical formula of a Ru precursor used in a prior art.
Figure 2B:
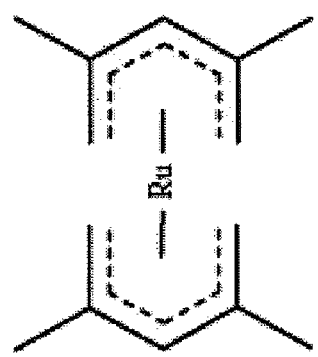
FIG. 2(b) is a chemical formula of a Ru precursor that can be used in an embodiment of the present invention.
Figure 2A:
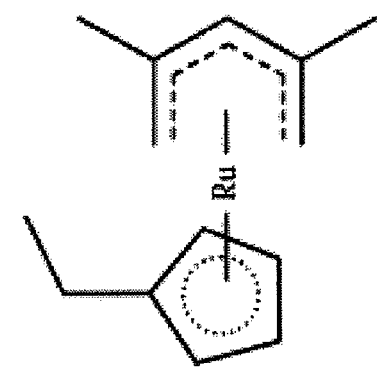
FIG. 2(a) is a chemical formula of a Ru precursor that can be used in an embodiment of the present invention.

FIG. 2(a) shows one example of a Ru precursor that can be used in an embodiment of the present invention. This precursor has one pentadienyl group and one cyclopentadienyl group attached to Ru. In FIG. 2(b), two pentadienyl groups are attached to Ru. Using these Ru precursors, a thin but continuous film can be formed easily by, for example, repeating the Ru-material supply step and $NH_3$-plasma treatment step shown in FIGS. 1(a) and (b). If the Ru precursor having two cyclopentadienyl groups attached to Ru, as shown in FIG. 2(c), is used, on the other hand, formation of a continuous film requires a thicker film than when the Ru precursors in FIGS. 2(a) and (b) are used. It is assumed that this is because with the Ru precursors shown in FIGS. 2(a) and (b), the adsorbed pentadienyl group of the Ru material easily becomes unstable on the substrate surface and promotes adsorption of the Ru material molecule. Also in the next step, introduction of $NH_3$ plasma causes the pentadienyl group to detach easily, and in the case of the Ru precursor in FIG. 2(b) the other group attached to the Ru material also becomes unstable and detaches. On the other hand, the Ru material having two cyclopentadienyl groups remains stable on the substrate and thus the pentadienyl groups detach slowly from the Ru material even when $NH_3$ plasma is introduced in the next step. This creates areas where the pentadienyl group is partially absorbed, detached or not yet detached, which ultimately makes it difficult for a smooth Ru film to form. Therefore, it was found that a continuous Ru film with a thickness of only approx. 1 nm could be formed by repeating a step to introduce a Ru material molecule having at least one pentadienyl group, and a $NH_3$ or $H_2$-plasma treatment step. With the precursor shown in FIG. 2(c), it was difficult to form a continuous film unless the thickness was 3 nm to 4 nm.

Figure 3:
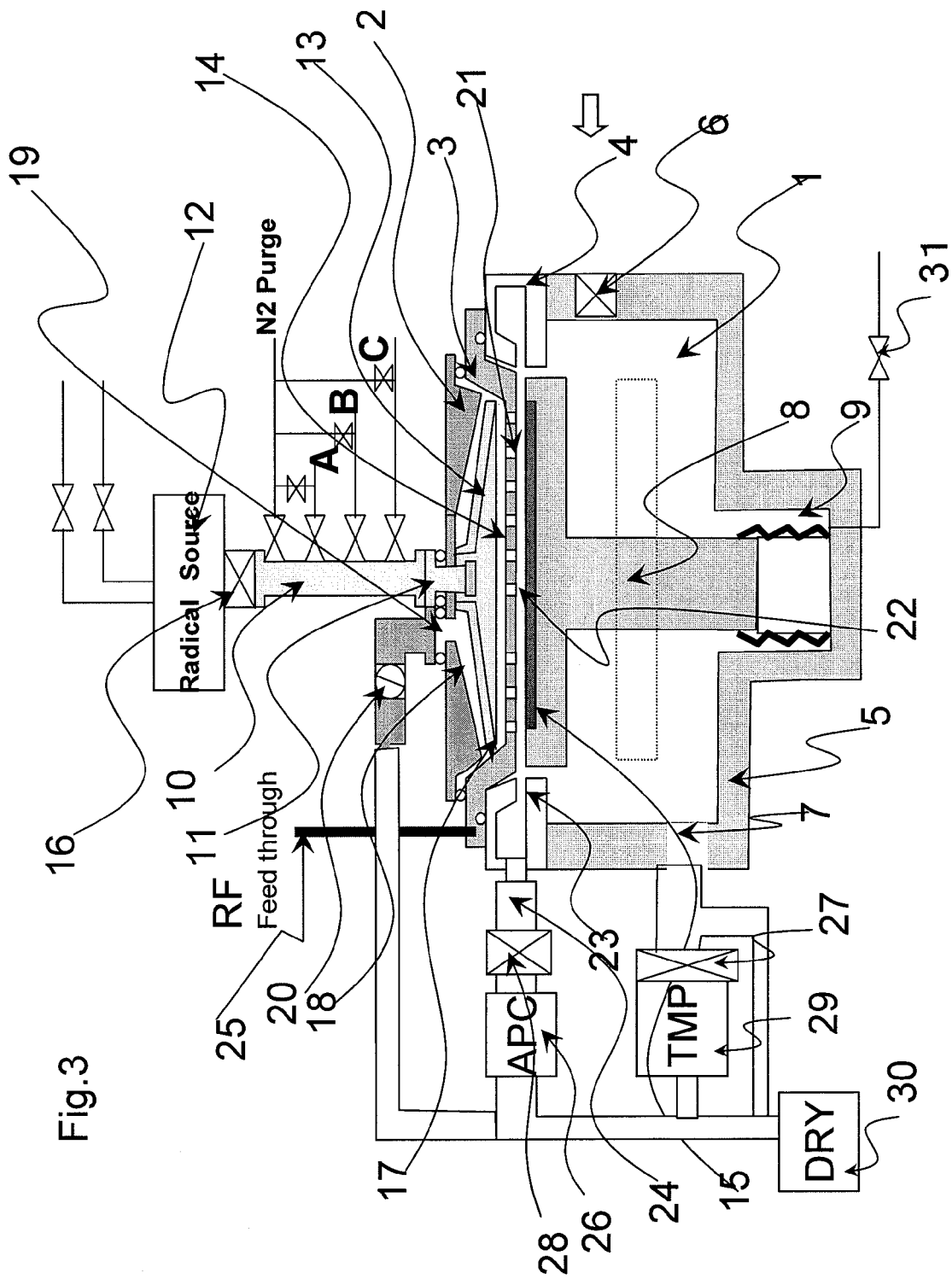
FIG. 3 is a schematic diagram illustrating a thin-film forming apparatus that can be used to implement the present invention.

FIG. 3 shows one example of a thin-film forming apparatus that can be used to implement the present invention. This thin-film forming apparatus allows a semiconductor substrate, which is a processing target, to be transferred to a reaction chamber 1 from a vacuum transfer chamber (not illustrated), and a thin-film forming process can be implemented in this reaction chamber 1. This reaction chamber comprises an upper lid 2, dispersion plate 3, exhaust duct 4, lower chamber 5, substrate transfer gate 6, exhaust port 7, substrate heater 8, and substrate-heater up/down bellows 9. After having been introduced into the reaction chamber 1, the semiconductor substrate is placed on the substrate heater and the substrate heater can be moved upward to obtain an optimal distance between the dispersion plate 3 and the substrate.

Also, the upper lid is connected to a gas introduction pipe 10 and gas introduction part 11. A reactive gas is connected to the pipe 10, and a nitrogen gas or inactive gas for purging the reactive gas is also connected. The pipe 10 is also connected to a radical source 12 via a gate valve 16, and various types of radical gases generated in the radical source 12 can be introduced by opening the gate valve 16. The gas introduction part 11 connects to a gas dispersion part 13, and the gas introduced from the gas introduction part diffuses and disperses in the gas dispersion part 13. The gas introduction part 11 may also have a dispersion structure that allows a gas to be introduced in a dispersed manner into the gas dispersion part 13. The gas diffused in the dispersion part 13 reaches a space 14 between the dispersion part 13 and the dispersion plate 2. A slit-type exhaust port 17 is formed between the tip of the gas dispersion part 13 and the dispersion plate 2, and this slit is provided in a circular form at the tip of the dispersion part 13. Numeral 18 is a space continuing to this exhaust slit 17, and this space 18 is formed by the outer wall of the dispersion part 13 and the upper lid 2, and continues to the space surrounding the gas introduction part 11.

Formed on the upper lid is a flange connection port for exhaust 19 that continues to this space 18, and also to an exhaust valve 20. On the other hand, the gas that has passed the gas dispersion part 13, the space 14, and a gas discharge port 21 provided on the dispersion plate 3 to finally reach a space 22 between the substrate-heating table 8 and the dispersion plate 3, further travels to reach the surface of a substrate 15, and then is discharged through a ring slit 23 formed in the exhaust duct 4 and out of an exhaust pipe 24 continuing from the slit. High-frequency electrodes are introduced to the dispersion plate 3 through 25 to generate plasma between the dispersion plate 3 and the substrate-heating table 8.

FIGS. 4(a) and (b) show how to evaluate the continuity of a Ru film. FIG. 4(a) applies to a case where the Ru film is non-continuous, while FIG. 4(b) applies to a case where the Ru film is continuous. A WNC film 402 is formed on a $SiO_2$ film 403, and then a Ru film 401 or 401' is formed, after which the obtained sample is soaked in a wet-etching solution 404 (a mixed acid consisting of hydrochloric acid and hydrogen peroxide) that can dissolve the WNC film, to measure and quantify via ICP mass spectrometry the amount of tungsten (W) 405 eluted from the WNC film into the wet-etching solution. The schematic diagram in (a) shows a condition of how the WNC film is etched by pinholes when the Ru film 401 is not continuous. In (b), on the other hand, the Ru film 401' is continuous if the core density is high, in which case the wet-etching solution cannot reach the WNC film and thus no tungsten atoms eluted from the WNC film are detected in the etching solution. While wet-etching solution is a mixed acid consisting of HCL, $H_2O_2$ and $H_2O$ mixed at 1:1:20 that etches WNC films to cause elution, this solution does not etch Ru films. Therefore, if the Ru film is not continuous, the underlying WNC film is etched and its constituents are eluted. Accordingly, the amount of W can be detected by measuring the etching solution via ICP mass spectrometry.

Figure 5:
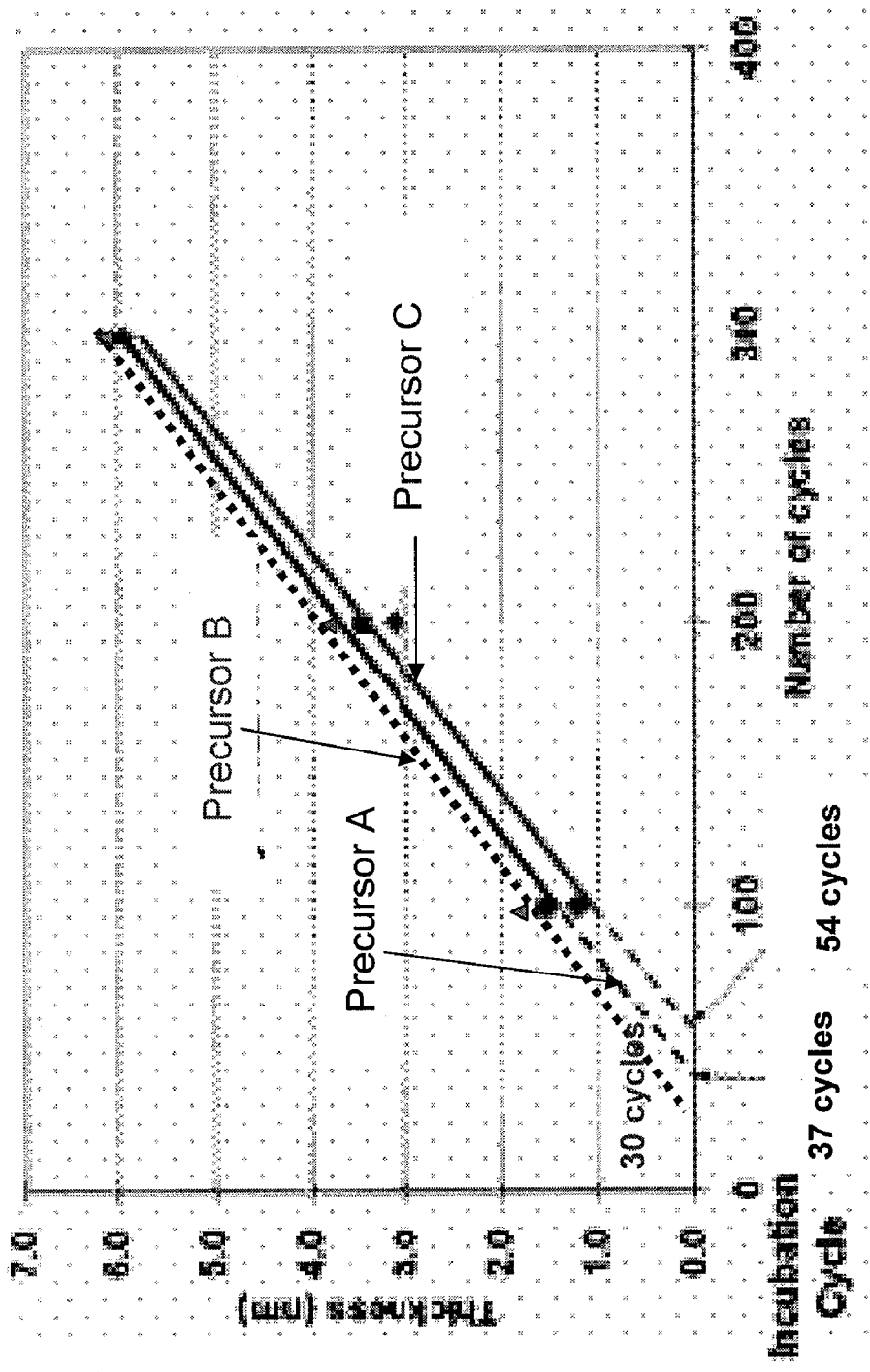
FIG. 5 is a graph showing one example of the dependency of Ru growth speed on number of cycles, when the Ru material shown in FIG. 2(a), (b) or (c) is used.

FIG. 5 shows the dependence of Ru growth speed on number of cycles when the Ru material shown in FIG. 2(a), (b) or (c) was used. The film forming conditions are explained in Example 2 later. As for the number of cycles, the step shown in Table 2 under Example 2 was defined as constituting one cycle, and how many times this cycle is repeated was counted. The incubation cycles (corresponding to the thickness zero point obtained by extrapolating the proportional relationship of thickness and number of cycles) for the Ru materials in FIGS. 2(a), (b) and (c) were 37 cycles, 30 cycles and 54 cycles, respectively.

Figure 4:
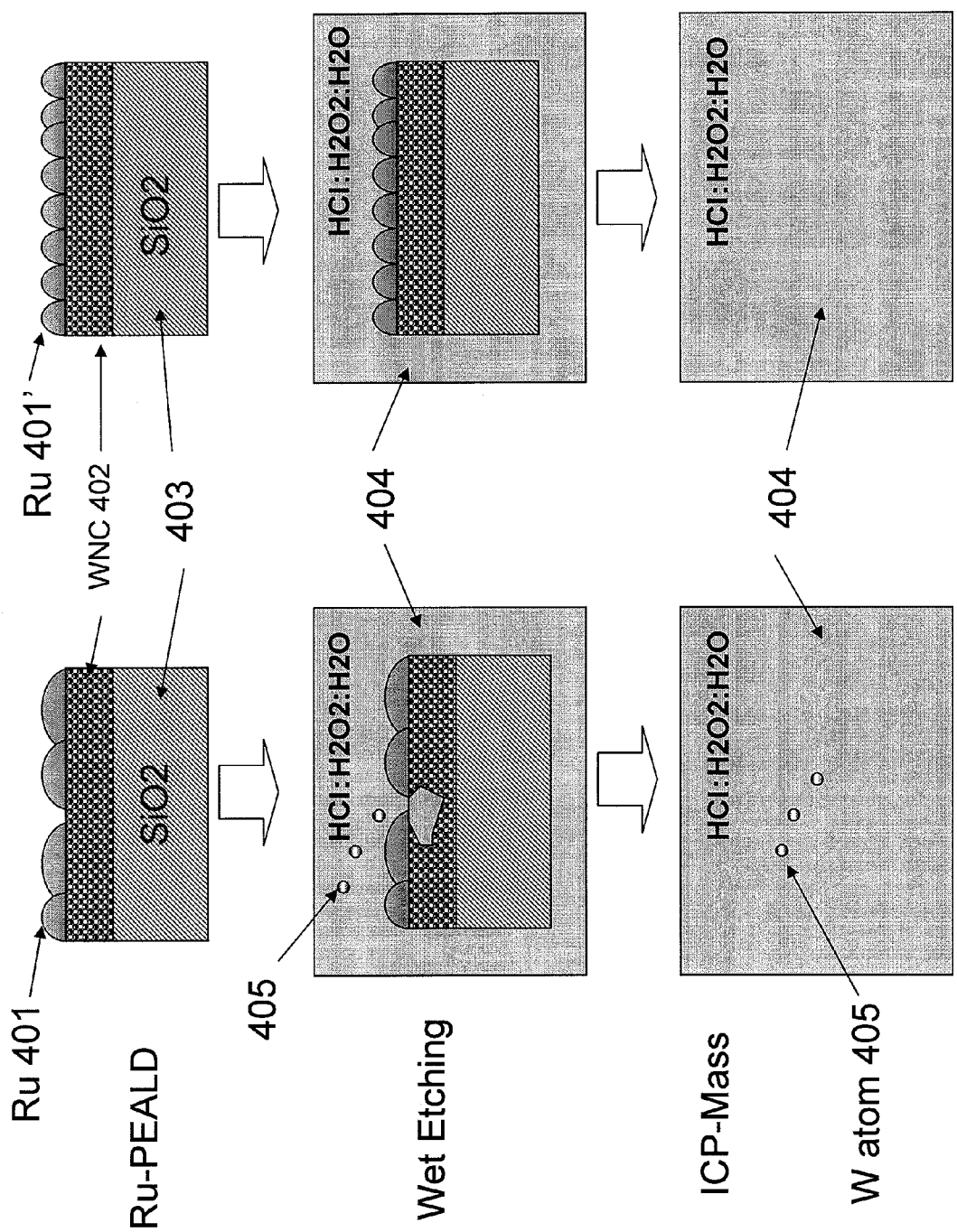
FIG. 4(a) and FIG. 4(b) are schematic diagrams illustrating a method to evaluate the continuity of a Ru film, where the Ru film shown in FIG. 4(a) is non-continuous, while the Ru film shown in FIG. 4(b) is continuous.
Figure 6:
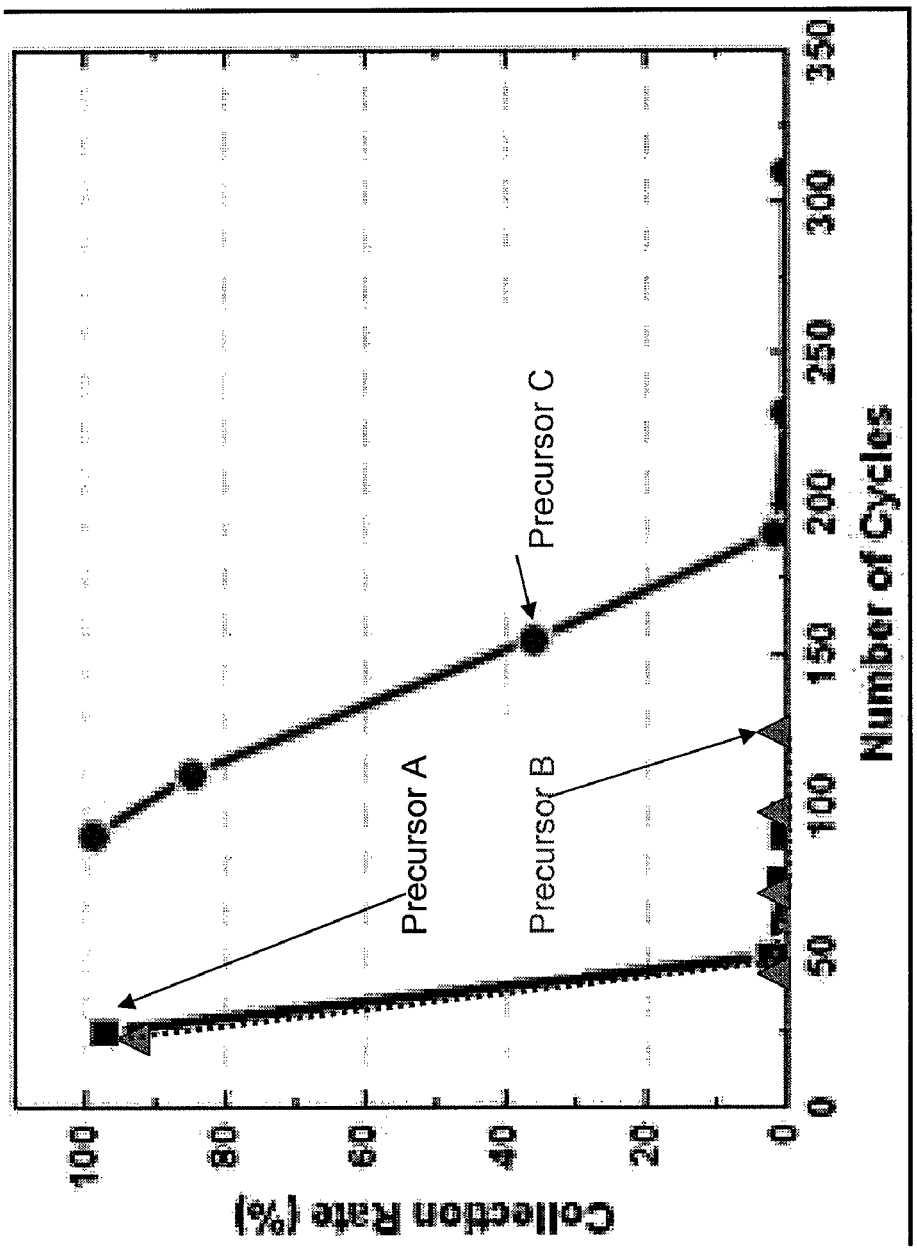
FIG. 6 is a graph showing one example of the relationship of the film forming cycles with the Ru film formed in FIG. 5, and the amount of W detected from the underlying layer, when the method illustrated in FIG. 4 is used.

FIG. 6 shows the relationship of the number of cycles for the Ru film formed in FIG. 5, and the detected amount of W, as obtained using the method illustrated in FIG. 4. Here, the collection rate indicates the percentage of the actual amount of W atoms detected, to the total W atoms in the WNC film beneath the Ru film by assuming that all W atoms have eluted into the etching solution. "100%" indicates that all were etched, while "1%" indicates that an amount of W corresponding to 1% of total W atoms has been detected. With the Ru precursors in FIGS. 2(a) and (b), a nearly perfect continuous film was formed after 50 cycles. With the Ru precursor in FIG. 2(c), on the other hand, a continuous film was not formed for 200 cycles.

FIG. 7 shows a process flow where the aforementioned process is applied to a dual-damascene Cu wiring process.

FIGS. 7(a) through 7(d) are schematic cross-section drawings showing a wiring structure of a semiconductor element, presented to explain a process of forming a dual-damascene copper wiring structure conforming to one embodiment of the present invention. Specifically, these diagrams explain a process of lining the entire surface of trenches and contact vias in a dual damascene structure with a metal barrier film using the ALD method, followed by the formation of a Ru film and a copper layer.

FIG. 7(a) illustrates a dual damascene structure prior to the formation of metal barrier layer. A dielectric diffusion barrier 202 is formed on a conductive wiring layer 201, and a bottom insulation layer 203 is formed on top of the dielectric diffusion barrier 202, while an etching stop layer 204 is formed on the bottom insulation layer 203. A top insulation layer 205 is formed on top of the etching stop layer 204. The etching stop layer 204 is used to form trenches 208 of a desired wiring pattern. The trenches 208 are etched on an etching mask layer level, and formed between two insulation layers 205, 203. The etching stop layer 204 is patterned and etched prior to the formation of the top insulation layer 205, and constitutes a hard mask that clearly defines a desired horizontal dimension of contact vias extending from the bottom of trenches 208. In the area where the etching stop layer 204 comprising hard mask is etched off, contact vias 207 connecting from the bottom of trenches 208 to the lower conductive wiring layer 201 are opened. Numeral 206 indicates a layer where chemical mechanical polishing is stopped in the smoothing step.

FIG. 7(b) illustrates the pre-treatment process in one embodiment of the present invention. This process comprises removing the oxide formed on the copper wiring surface at the bottom of contact vias 207, and pre-treating the surface of interlayer insulation films 203, 205 exposed in the damascene structure (for example, by introducing H2/He gas for 30 seconds at a RF output of 800 W, and then introducing H2/H2/N2 mixture gas for 60 seconds at a RF output of 300 W). This terminates the surface of interlayer insulation films in the damascene structure with —NH and —NH2 bonds. This termination is difficult to achieve only through simple heat treatment using NH3 gas. When NH3 is activated using high-frequency waves, however, the surface can be terminated using NH and NH2 bonds just like when plasma-activated H2/H2/N2 mixture gas is used.

As for the amino groups to be introduced to the surface of SiO2, SiOC or SiO, etc., if the coordination number of N with respect to atoms on the surface is 1, N, which is a three-coordinate atom, bonds with an atom on the surface and a —NH2 terminal is formed on the surface. If the coordination number is 2, a >NH terminal is formed on the surface. In other words, the surface terminal structure desirable in one embodiment of the present invention is —NH2 or >NH. As explained below, TEB gas and other reducing gases are considered to be adsorbed in the form of substitution with H in this —NH2 bond or >NH bond as shown in FIG. 4, and therefore the presence of —NH2 or >NH is required on the surface. >NH occurs in the case of Si—NH—Si or SiONHOSi, for example. In FIG. 1(b), "x" in —NHx represents 1 or 2.

In an embodiment, introduction of amino groups to the surface occurs not only on the surface of low dielectric constant film, but also on the surface of metal wiring layer at the bottom of vias, as shown in FIG. 7(b).

If a SiOC low dielectric constant film, which is to be used widely on next-generation devices, is adopted as the insulation films 205, 203 shown in FIG. 7(a), the carbon-containing side chains in the SiOC film, such as chains of methyl groups which are alkyl groups, are etched by high-frequency plasma with NH3 gas and consequently CH3, C2H5 and other alkyl groups in the SiOC film are lost. This sometimes causes the contact vias 207 to deform into a barrel shape. If damage to insulation films 205, 203 by high-frequency plasma is suspected, using high-frequency plasma with H2/He/N2 gas can reduce the negative effect on the SiOC film. In one embodiment, the partial pressure of nitrogen in H2/He/N2 is 5 to 50%, or more preferably 10 to 30%. As for the RF output frequency, it can be adjusted to 13.56 MHz (normally 2 MHz or above, but not exceeding 60 MHz). In addition to He, Ar and other inactive gases can also be used. In one embodiment, the process conditions may be set as follows:

In the above explanation, "plasma" refers to so-called parallel-plate plasma generated by high-frequency RF waves of 13.56 kHz, for example, applied between a showerhead and a heating stage on which a substrate is placed. In other words, a substrate is present in a plasma generation atmosphere. Therefore, this process is affected by active species with short life that are generated in plasma, such as ionic active species. Meanwhile, there is a method whereby plasma is generated in a place away from a substrate (using a remote plasma apparatus), and among the activated molecules the neutral molecules with long life are transported to the substrate and used in the surface treatment. This is called radical process. In other words, "radicals" refer to molecules in an electron-excited state compared to a normal (ground) state where electrons are stable. Although radicals are not ionic, they are activated and reactive. In one embodiment of the present invention, plasma and radical can be used interchangeably. Those skilled in the art should be able to determine appropriate radical generation conditions from the corresponding plasma generation conditions.

In the process explained above, amino groups are introduced to the surface via plasma. It is difficult to thermally introduce amino groups without using plasma. For example, introduction of amino groups is difficult to achieve only via supply of NH3. However, introduction of amino groups to the surface is possible without using plasma, if N2H2 gas (hydrazine), etc., is used. In one embodiment, the process conditions using hydrazine may be set as follows. The partial pressure of hydrazine with respect to the total flow rate is preferably between 10 and 50%.

In the step indicated by FIG. 7(c), TEB (triethyl boron) gas or other reducing gas is introduced and then purged with inactive gas, after which WF6 gas or other metal halide is introduced and then purged with inactive gas, after which NH3 gas or other halogen-substituting nitride gas is introduced and then purged with inactive gas. By repeating these introductions and purges, a smooth WNC film or other barrier film containing metal atoms (also called metal barrier film) 209 can be formed on the surface of a damascene structure. Barrier film is sometimes referred to as conductive film, but use of this term is limited to situations where difference from insulation films is emphasized. Barrier films are not always electrically conductive.

As for the reducing gas, B2H6, alkyl boron compound, SiH4, Si2H6 or alkyl silicon compound can be used instead of TEB. As for the metal halide, TaF6 or TiCl4 can be used instead of WF6. As a result, the barrier film containing metal atoms can be formed as a TaN, TaCN, WN, TiN or TiCN film instead of WNC film.

As mentioned earlier, the surface on which the above barrier film is formed is terminated with amino groups. By repeating the process of introducing reducing gas, metal halide, and then halogen-substituting nitride gas, a smooth, uniform barrier film can be formed. U.S. Pat. No. 6,759,325 discloses a method to cause WF6 to be adsorbed to the interior surface of trenches and vias that form a damascene wiring structure, and then reduce the surface using TEB or other reducing gas. However, introduction of a metal halide precursor may damage the interlayer insulation film or cause permeation into the film.

In an embodiment, the barrier film thickness is adjusted to a range of 1 to 5 nm, or preferably to a range of 2 to 4 nm.

In the step illustrated by FIG. 7(d), a second metal film 210, such as Ru film, is formed on top of the barrier film 209, such as a WNC film, using plasma ALD or other method. Here, the second metal film is formed on top of the metal barrier film that has been formed after pre-treatment. This film comprises Ru, Ta or other material offering good adhesion with the copper film used for wires, and acts as a so-called glue layer or adhesive layer. In other words, this film is sandwiched between the copper wiring and the conductive film functioning as a copper diffusion barrier and improves the adhesion between the two.

Ru-ALD can be formed by the plasma ALD method in which the compound described earlier and NH3 plasma are supplied alternately. Since a Ru film is formed in a reducing atmosphere, a laminated structure can be created without oxidizing the WNC film 209.

In an embodiment, the thickness of the second metal film is adjusted to a range of 1 to 10 nm, or preferably to a range of 1 to 3 nm.

FIG. 7(e) shows a step of seeding copper 211 to fill the via/trench with copper. In FIG. 7(f), an excess copper layer above the via/trench is removed by CMP, and the surface of the element is further planarized by CMP, so that the WNC film 209 and the Ru film 210 are removed from the top surface, thereby forming an interconnect copper line 212.

In the above, the 1st RF power may have a frequency of 13 MHz to 30 MHz, and the 2nd RF power may have a frequency of 300 kHz to 450 kHz. The 2nd RF power may be lower than the 1st RF power. According to the above conditions, a SiC film having a thickness of about 2 nm to about 10 nm, preferably about 2 nm to about 5 nm can be formed.

Figure 8B:
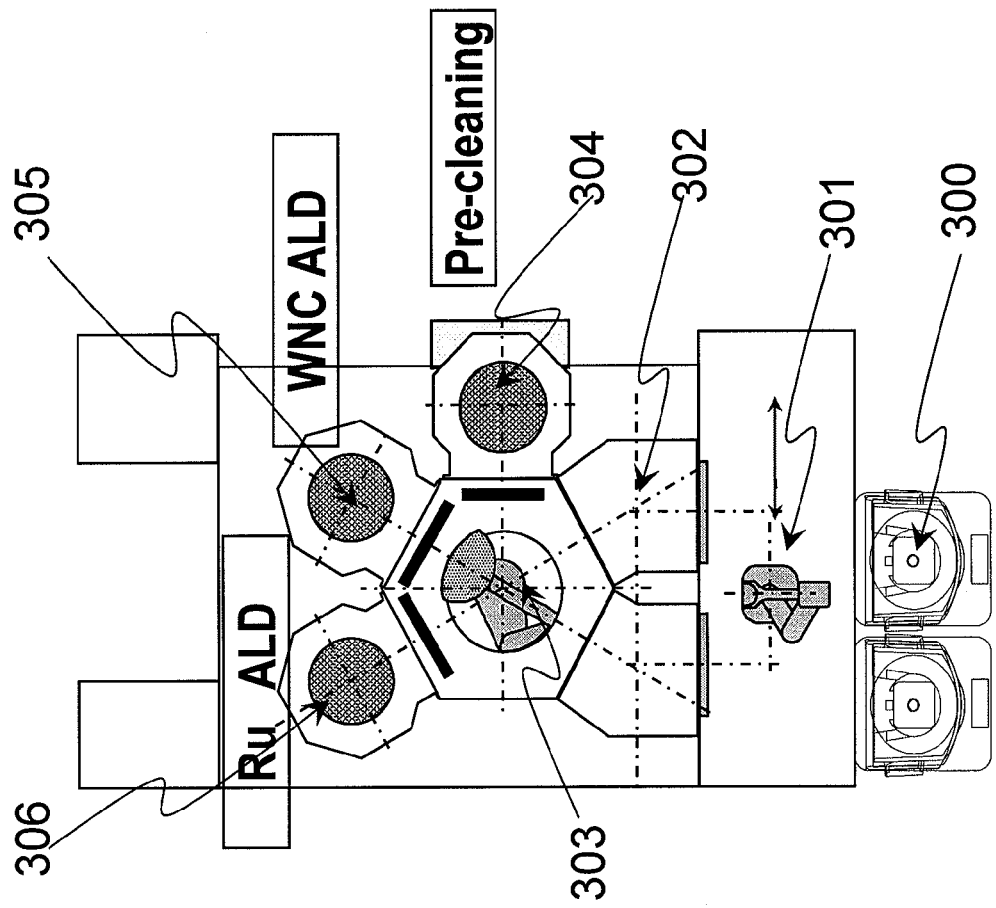
FIG. 8(b) is a structural diagram illustrating one example of a vacuum-cycle cluster apparatus used to implement the aforementioned process.
Figure 8A:
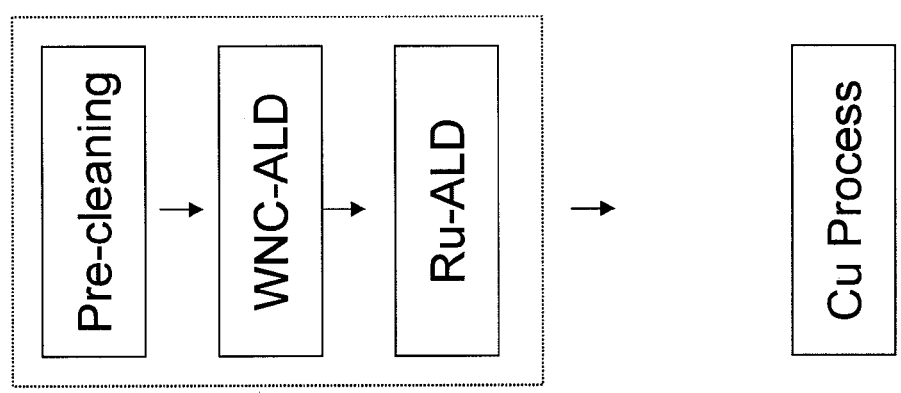

FIG. 8(b) is a structural drawing showing an example of processing apparatus usable in an embodiment of the present invention. This apparatus has a clustered structure to handle different process steps. FIG. 8(a) shows process flows conforming to an embodiment of the present invention. The steps enclosed by dotted lines are processed in the apparatus illustrated in FIG. 8(b).

In FIG. 8(a), for example, a substrate is transferred from a cassette box 300 to a load lock chamber 302 by means of an atmospheric pressure robot 301, after which the substrate is transferred to a pre-treatment module 304 by means of a center handler 303 provided on a center platform 303 to receive pre-treatment based on a plasma process using N2/H2/He gas. Then, the pre-treated substrate is transferred in vacuum to a WNC-ALD module 305 to receive WNC-ALD process, and then further transferred in vacuum to a Ru-ALD module 306 to form a Ru-ALD film. Since the surface of WNC film is easily oxidized upon contact with atmosphere, transferring substrates in vacuum, as explained above, is extremely effective in the formation of Ru-ALD film.

FIG. 9(a) shows one example of the structure of a reaction apparatus used to implement, in an embodiment of the present invention, the process comprising a step to form a Ru film on WNC according to the method proposed by the present invention, and a step to form a Ru film in an oxidizing atmosphere by means of CVD. This thin-film forming apparatus allows a semiconductor substrate, which is a processing target, to be transferred into a reaction chamber 101 from a vacuum transfer chamber (not illustrated) through a gate valve 142, and a thin-film forming process can be implemented in this reaction chamber 101. A transferred substrate 146 is placed on a heating table 102, and its surroundings can be evacuated through a valve 127 using a molecular pump 129 (TMP). Thereafter, the substrate-heating table 102 is raised by means of bellows 114 until an optimal distance is achieved from a shower plate. As a result, the reactive gas supplied from the shower plate is supplied to the surface of the substrate 146, and then discharged via an exhaust duct 103. At this time, a valve 131 can be opened to supply an inactive gas, in order to prevent the reactive gas supplied through a shower plate 104 from diffusing to the transfer side where the bellows 114 are located.

This reaction chamber comprises a layered structure where the exhaust duct 103, the shower plate 104 and an upper lid 113 are placed on top of each other, and a gas dispersion nozzle 111 (FIG. 9(b)) and a gas dispersion guide 108, which continue to a gas introduction pipe 110, are located between the shower plate 104 and the upper lid 113. In addition, an exhaust valve 109 for evacuating the dispersion part is connected along the gas dispersion guide. Also, a gas introduction part 105, gas introduction valve 124 and gas exhaust valve 132 are connected to the shower plate 104. An inactive-gas introduction valve 123 for purge is also connected. Furthermore, a gas introduction valve 121 and inactive-gas introduction valve 120 for purge are connected to the gas introduction pipe 110. A Ru material gas is introduced through the valve 121. Also, a valve 122 is formed to introduce an inactive gas at a high flow rate. The Ru material introduced to the gas introduction pipe 110 through the valve 121 is dispersed by the gas dispersion nozzle 111 and flows along the gas dispersion guide, after which it passes through a gas discharge hole 112 in the shower plate 104 and is supplied onto the substrate 146. On the other hand, the NH3 gas or O2 gas supplied through the gas valve 124 travels through the gas introduction part 105 provided in the shower plate 104 and diffuses into a gas dispersion chamber 107, and is then supplied onto the substrate 146 through a gas discharge hole 106. At this time, high-frequency waves are applied to the shower plate 104 to excite plasma between the grounded substrate-heating table 102 and the shower plate 104, to treat the surface of the substrate 106 by means of NH3 plasma. Also, the gas supplied onto the substrate 146 is discharged by a vacuum pump 130 via the exhaust duct 103 and through an exhaust valve 125 and a pressure control apparatus (APC) 126.

When the reactive gas is purged, an inactive gas is introduced through the gas valves 120 and 122, while the exhaust valve 109 is opened to discharge the remaining Ru material. At this time, although the remaining Ru material is also discharged from the exhaust duct 103 via the gas discharge hole 112, the apparatus is designed so that the exhaust conductance through the valve 109 becomes at least one digit higher, and therefore most of the remaining gas is discharged through the exhaust valve 109. When the NH3 gas supplied from the gas valve 124 is purged, similarly an inactive gas is introduced through the valve 123, while the exhaust valve 132 is opened to discharge the remaining gas. At this time, although some gas is discharged through the gas discharge hole 106 via the exhaust duct 103, the greater gas exhaust conductance of the exhaust valve 132, compared to that of the gas discharge hole 106, causes most gas to be discharged through the exhaust valve 132.

By utilizing the functions explained above, a process apparatus ideal for an atomic layer deposition process where reactive Ru material gases are supplied alternately, or a layer-by-layer thin-film forming process, can be provided.

Also, chemical vapor deposition can be implemented by simultaneously supplying a Ru material and O2 gas. In this case, the Ru material supplied through the valve 121 travels through the gas discharge hole 112 and is supplied to the substrate surface, while the O2 gas supplied through the valve 124 travels through the gas discharge hole 106 and is supplied to the substrate surface. As the Ru material and O2 react with each other on the substrate surface by means of chemical vapor reaction, a thin Ru film is formed.

Figure 10:
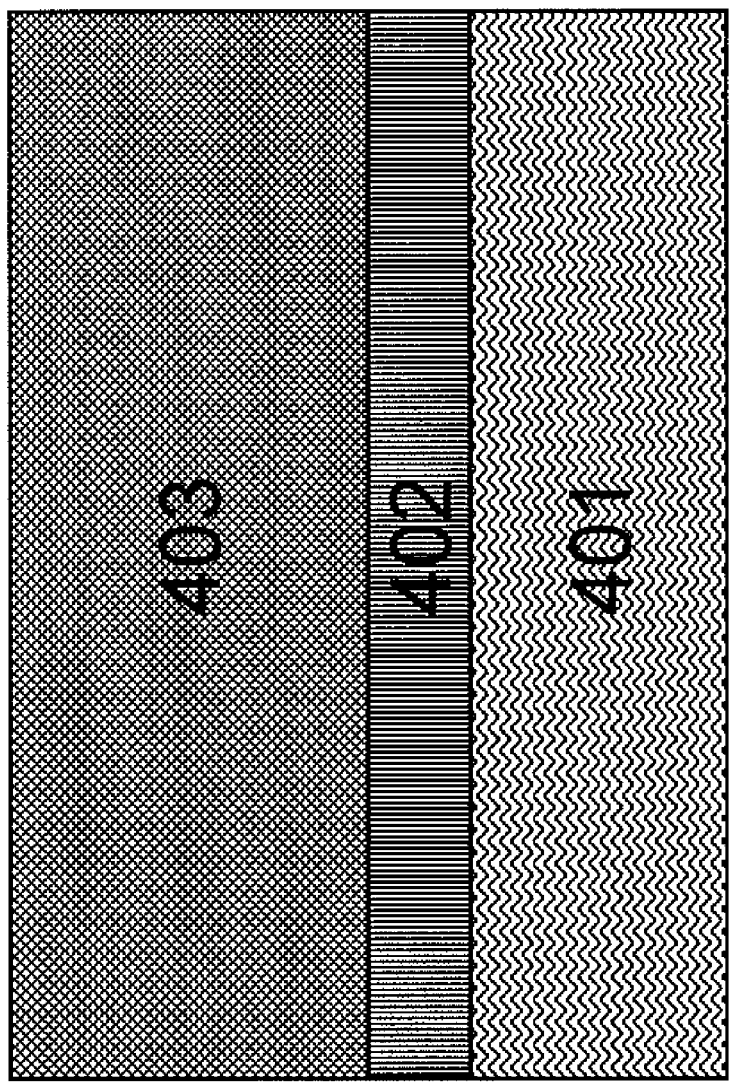
FIG. 10 is a schematic diagram illustrating a cross-section structure of the capacitor electrode described in Example 3.

FIG. 10 is a schematic diagram illustrating a cross-section structure of the capacitor electrode described in Example 3. This structure is produced by forming a Ru film 402 on a WNxCy film 401 according to an embodiment of the present invention, and then depositing a Ru film or RuO2 film on top by means of a chemical vapor deposition method.

Figure 11:
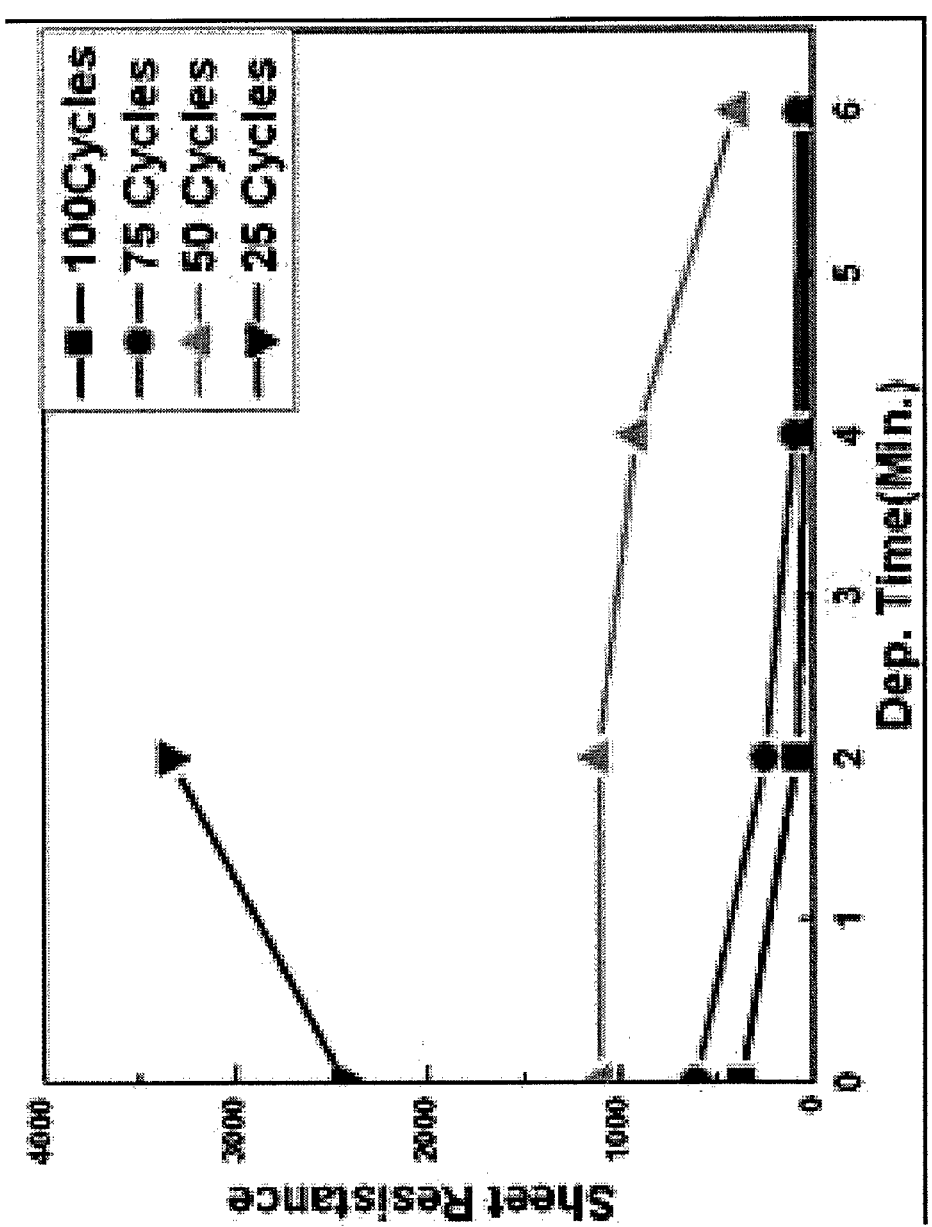
FIG. 11 is a graph showing the dependency of sheet resistance on number of cycles for ALD-Ru film in an embodiment of the present invention, wherein the sheet resistance pertains to a layered sheet obtained by forming an ALD-WNC film by ALD using $WF_6$, $NH_3$ or TEB gas, forming on top of this ALD-WNC film an ALD-Ru film formed by ALD using a Ru material and $NH_3$ gas plasma, and then layering on top a Ru—CVD film formed by CVD using the same Ru material and oxygen.

FIG. 11 is a graph showing the dependency of sheet resistance on number of cycles for ALD-Ru film, wherein the sheet is produced by forming, on top of an ALD-WNC film formed by ALD using WF6, NH3 or TEB gas, an ALD-Ru film by ALD based on NH3 gas and plasma using a Ru film according to an embodiment of the present invention, and then layering on top a Ru-CVD film formed by CVD using the same Ru material and oxygen. In this example, the Ru precursor shown in FIG. 2(a) is used.

The specific structures of these samples are explained. First, four types of underlying Ru films were formed by plasma ALD (in accordance with the film forming conditions shown in Table 2 under Example 2). The four types correspond to different numbers of cycles of 25, 50, 75 and 100 (in other words, the cycle consisting of four steps shown in Table 2 under Example 2 was repeated 25 times, 50 times, 75 times and 100 times, respectively). On each Ru film thus produced, a Ru-CVD film was formed by chemical vapor deposition, and the time needed to form this film is shown by the horizontal axis. Here, when a Ru-CVD film is formed in an oxidizing atmosphere on a Ru film formed by 25-cycle plasma ALD, the oxygen gas diffuses and oxidizes the underlying WNC film if the Ru film by plasma ALD is not continuous. As a result, the sheet resistance, which naturally decreases with time, increases instead.

On the other hand, formation of a Ru-CVD film by chemical vapor deposition on a Ru film formed by 75 and 100-cycle plasma ALD does not increase the resistance, and the underlying WNC film is not oxidized.

FIG. 12(a) shows one example of the structure of a forming apparatus that can be used in an embodiment of the present invention, wherein the material used to form a Ru film 402 is different from the material used to form a Ru film 403 by chemical vapor deposition. The same components constituting the structure shown in FIG. 9(a) are denoted by the same numerals. The difference from FIG. 9(a) is that a material supply container 138 is provided in FIG. 12(a) for supplying the second Ru material (Ru(C)). This material supply container 138 is connected to a carrier-gas supply line 133 via a carrier-gas introduction valve 136, and also connected to the reaction apparatus via a material supply valve 137. In this figure, Ru(A) and Ru(C) are supplied to the reaction apparatus through the same line. However, how the materials are supplies is not limited to this configuration and separate lines may be used to supply the respective materials to the reaction apparatus.

Specific examples are explained below by using FIGS. 1 through 12 described above.

EXAMPLE 1

According to the process sequence in FIG. 1(b), in the process of forming a metal film and then forming a Ru film using a Ru material based on ammonia plasma ALD, a WNC film formed by ALD was used as the underlying metal film. The WNC film was formed by a process using WF6, NH3 or TEB (triethyl boron) (under the conditions shown in Table 1 under Example 2). Ru-ALD films were formed using the Ru materials shown in FIGS. 2(a), (b) and (c) as well as the forming apparatus shown in FIG. 3 (under the conditions shown in Table 2 under Example 2). The results were compared to examine the relationship of pinholes and number of cycles with each film.

FIG. 5 shows the relationship of Ru film thickness and number of cycles. The precursor shown in FIG. 2(c) (hereinafter referred to as "Precursor C") required 57 cycles, while the precursor shown in FIG. 2(a) (hereinafter referred to as "Precursor A") and the precursor shown in FIG. 2(b) (hereinafter referred to as "Precursor B") require 37 cycles and 35 cycles, respectively. FIG. 6 shows the revealed relationship of pinholes and number of cycles with each film. Through quantitative analysis, based on the ICP method, of the amount of tungsten eluted from a unit area of the chip on which a Ru/WNC layered film was formed, using the method illustrated in FIG. 4, the percentage of eluted tungsten to the total tungsten content in the WNC film was measured.

FIG. 6 shows the numbers of cycles corresponding to different collection rates (%) for the Ru materials shown in FIGS. 2(a) and (b). With these Ru materials, the collection rate became 0% at around 50 cycles and 55 cycles or more, respectively. Since tungsten does not elute into the etching solution at a collection rate of 0%, it is determined that continuous films were formed at these cycles. With the Ru material shown in FIG. 2(c), on the other hand, around 200 film forming cycles were needed to achieve a collection rate (%) of roughly 0, at which point tungsten elution is considered none. The sequential process using NH3 plasma as shown in FIG. 1 can form a continuous film over short cycles if a Ru molecule having a pentadienyl group, such as Precursor A or B, is used. With a Ru molecule having only a cyclopentadienyl group, such as Precursor C, however, a continuous film cannot be formed for at least 200 cycles.

As shown in FIG. 5, while the film growth speed per cycle was roughly the same with any Ru molecule, the required incubation time varied among Precursors A, B and C at 37 cycles, 30 cycles and 54 cycles, respectively. When the numbers of cycles at which the formed film was considered continuous were 50 cycles, 50 cycles and 200 cycles, respectively, the achieved film thicknesses were 0.44 nm, 0.3 nm and 3.4 nm, respectively. Therefore, with the materials shown in FIGS. 2(a) and (b) the film becomes sufficiently continuous if the film thickness is 0.5 nm or more. Also, in practice a semiconductor device has flat sections and stepped sections, and the process using a Ru material with NH3 plasma has been shown to provide a coverage of 70% over holes with an aspect ratio of 5. In other words, a continuous film can be achieved at a thickness of 0.7 nm or more, if device coverage is also considered. In practice, it is preferable to control the film thickness within a range of approx. 0.7 to 1.0 nm. High reliability can also be ensured with a thickness of 1.0 nm or more, because a higher margin can be achieved.

If the Ru material shown in FIG. 2(c) is used, on the other hand, the minimum thickness below which the film no longer became continuous was approx. 3 to 4 nm, which means that a Ru film needs to be 4 nm or thicker in practice. As a result, using this Ru material for actual copper wiring decreases the copper wiring volume by the increased thickness of the Ru film, thus virtually resulting in a higher wiring resistance. To prevent this problem, a thinner Ru film is required. Since the method proposed by the present invention allows for use of a Ru film of 1 nm or thinner, the copper volume can be increased and wiring resistance decreased, while ensuring good adhesion between the copper wiring and Ru.

With the Ru material having a pentadienyl group, it is considered that the ALD method using NH3 plasma, as explained in this example, allows the Ru component to detach easily by means of NH3 plasma, thus increasing the core formation density and thereby allowing a continuous film to form easily at a small film thickness. If the Ru material only has a cyclopentadienyl, on the other hand, the cyclopentadienyl does not detach easily even under NH3 plasma, and therefore a continuous film does not form easily.

EXAMPLE 2

This example shows an application of the present invention to the formation of a wiring process using a dual-damascene structure, which is the most commonly used copper wiring structure, and the effects of such application.

FIG. 7 shows a process to form a dual-damascene structure. FIGS. 7(a) through (f) show a process flow starting from a condition after completion of dual-damascene processing. FIGS. 8(a) and (b) show the structure of the cluster apparatus (FIG. 8(b)) and the cluster process sequence (FIG. 8(a)) used in this example. The cluster apparatus shown in FIG. 8(b) comprises a pre-cleaning module 304, a WNxCy-film forming module 305, and a Ru forming module 306, and performs a process based on continuous vacuum cycles, as shown in FIG. 8(a). FIG. 7(a) shows a condition after completion of dual-damascene processing. A SiOC film 202, interlayer insulation film 203, etching stopper film 204, interlayer insulation film 205 and copper-diffusion prevention film 206 are formed on a lower-layer copper wiring 201 to produce a copper-diffusion prevention layer. In this condition, pretreatment prior to the formation of ALD barrier film is performed using the pretreatment module 304 shown in FIG. 8. FIG. 7(b) shows a condition immediately after the pretreatment. Here, a step to reduce the oxide formed on the surface of the copper wiring 203 at the bottom of via contacts 207, is performed simultaneously with a processing to stabilize the surface of the processed end of 202, 203, 204, 205 and 206 constituting the interlayer insulation film over trenches 208 and via contacts 207 in the dual-damascene structure. This processing forms NH or NH2 groups on the surface. This surface treatment allows for smooth formation of a WNxCy film in the next step. After its surface has been treated with the pretreatment module 304 shown in FIG. 8(b), the substrate is transferred to the process module for WNC-ALD formation 305 as shown in FIG. 8(b) to form a WNC film. Table 1 shows the conditions for WNC-ALD formation implemented here (the values shown in the table can be modified within a range of ±50%).

TABLE 1

| Phase | Gas | Flow rate (Sccm) | Temp. (° C.) | Pressure (Pa) | Time (sec) |
|---|---|---|---|---|---|
| Reduction Gas | TEB | 300 | 350 | 150 | 2 |
| Purge | Ar | 2000 | 350 | 150 | 0.5 |
| Metal Precursor | WF6 | 300 | 350 | 150 | 0.2 |
| Purge | Ar | 2000 | 350 | 150 | 1 |
| Nitridation Gas | NH3 | 750 | 350 | 150 | 0.5 |
| Purge | Ar | 2000 | 350 | 150 | 1 |

By repeating the aforementioned steps, a smooth WNC film 209 of 3 nm can be formed, as shown in FIG. 7(c). Next in FIG. 7(d), a Ru film 210 is formed using the Ru-ALD module 306 shown in FIG. 8(b). Here, the Ru material shown in FIG. 2(a) was used, where the material was treated in a NH3 plasma process conforming to the sequence illustrated in FIG. 1(a). Table 2 shows the Ru-ALD process conditions. Although 800 W was used as the RF power of NH3 plasma, a Ru film can be formed in a RF power range of 200 to 1,000 W. A similar process can also be achieved at a forming temperature in a range of 250 to 400° C. A Ru film with a thickness of approx. 1 nm was formed over 100 cycles (under the conditions shown in Table 2 below; the values shown in the table can be modified within a range of ±50% and the process can be implemented in a similar manner with other Ru materials). A Cu seed film 211 shown in FIG. 7(d) is formed on a wafer that has been transferred from the apparatus shown in FIG. 8(b), after which a copper plating film is formed as shown in FIG. 7(e), to form a copper wiring 212 through CMP. A Cu film can also be formed via Cu plating after the Ru film 210 has been formed, or a Cu plating can be formed directly on the Ru film 210. For the Cu film 211, a Cu film formed by CVD or ALD instead of PVD may also be used.

As explained above, high reliability can be maintained by continuously performing the series of steps comprising surface treatment, WNC/Ru forming via ALD, and Cu plating. The layered WNC and Ru film structure formed by the aforementioned method had a thickness of 4 nm, which is smaller than when conventional barrier metals are used. As a result, lower copper wiring resistance was obtained.

TABLE 2

| Phase | Gas | Flow rate (Sccm) | Temp. (° C.) | Pressure (Pa) | Time (sec) |
|---|---|---|---|---|---|
| Ru Dose | Precursor A | 300 | 350 | 150 | 1 |
| Purge | Ar | 2000 | 350 | 150 | 1 |
| NH3 plasma | NH3 | 300 | 350 | 150 | 2 |
| Purge | Ar | 2000 | 350 | 150 | 1 |

EXAMPLE 3

Example of Ru—CVD/Ru-ALD

This example pertains to a very thin Ru film shown in Example 1 or 2, that is, a Ru film of approx. 1 to 4 nm used as a Cu-film adhesion layer. In certain applications such as the formation of a capacitor using a Ru film as the electrode, the Ru film needs to be formed thicker to a thickness range of approx. 10 to 20 nm. In the process shown in Example 1 or 2, however, the cycle illustrated in FIG. 1(a) needs to be repeated 500 times to form a film of 10 nm. If one cycle requires 3 seconds to complete, the total cycle time becomes 1,500 seconds, which significantly reduces the productivity of semiconductor devices. If a Ru film is formed by chemical vapor deposition, on the other hand, a Ru film can be formed using the Ru material shown in FIG. 2 and oxygen gas, or a $RuO_2$ film can be formed by adjusting the partial oxygen pressure.

While the structures shown in Examples 1 and 2 use a WNxCy film underneath a Ru film, with a general capacitor electrode a polycrystal silicon or TiN film, etc., is placed as the under layer of the electrode. If a Ru film is formed by a chemical vapor deposition method, the surface of the aforementioned polycrystal silicon, TiN, etc., is oxidized and the contact resistance increases as a result. This example illustrates how Ru and $RuO_2$ electrodes can be formed while suppressing this oxidization.

FIG. 9 is a structural diagram showing a cross-section view of the Ru film-forming apparatus used in this example. Ru Precursor A is supplied through a valve 121, while $NH_3$ or $O_2$ is supplied through a valve 140 or 123. Ar purge gas is supplied through valves 122 and 124.

First, a Ru film was formed by an atomic layer deposition method with $NH_3$ plasma based on the conditions shown in Table 2 under Example 2, after which $NH_3$ was changed to $O_2$ gas and Ru Precursor A and oxygen gas were supplied through 112 and 107 in the showerhead, respectively. Since the two gases do not mix in the showerhead, the gases do not react with each other in the showerhead but do so on the surface of the substrate 146 to form a Ru film.

FIG. 10 is a schematic diagram illustrating a cross-section structure where a Ru-ALD film 402 was formed on a WNC-ALD film 401 and then a Ru film 403 was formed by a chemical vapor deposition method. If the Ru film 402 is not continuous and exposed to an oxidizing atmosphere, the underlying WNC film 401 is easily oxidized. Therefore, the number of cycles performed to form the Ru film 402 was changed to 25, 50, 75 and 100, and the Ru film 403 was formed on the Ru film produced with each number of cycles. FIG. 11 shows how the sheet resistance changed with different numbers of cycles.

If a Ru film is formed without the WNC film 401 being oxidized, essentially the sheet resistance may decrease as the Ru-film 403 forming time increases. As shown in FIG. 11, the sheet resistance increased when the Ru film 402 was formed over 25 and 50 cycles. On the other hand, the sheet resistance decreased when the film was formed over 75 and 100 cycles. These results suggest that the Ru film 402 was not continuous and therefore the underlying WNC film was oxidized during the first 50 cycles. Meanwhile, it is likely that a continuous film that can prevent diffusion of oxygen was formed after 75 cycles. The film thickness achieved after 75 cycles was approx. 0.7 nm, while that achieved after 100 cycles was approx. 1 nm. In other words, it is considered that a continuous Ru film that can prevent diffusion of oxygen has been formed when the film thickness reaches 0.7 nm or more.

From the above, it is clear that as long as a Ru-ALD film 402 is formed on a WNC film 401 by 75 cycles or more to achieve a film thickness of 0.7 nm or more, the underlying WNC film is not oxidized even when the film is formed by chemical vapor deposition using a process involving oxygen gas. When a Ru film of 10 to 20 nm is formed, therefore, by using a chemical vapor deposition method where approx. 5 to 10 nm of Ru film can be formed per minute, it suffices to form an oxidization-preventing Ru-ALD film 402 to a thickness of 1 nm, and the remaining thickness of Ru film can be formed by a chemical vapor deposition method offering excellent productivity. This provides a technology that can realize superior productivity.

Also, as shown in FIG. 12 it is also possible to use an apparatus having a material container 135 that suppliers the Ru material shown in FIG. 2(a) to form a Ru-ALD film 401, and a material container 138 that supplies the Ru material shown in FIG. 2(c) to form a Ru film 402 by means of chemical vapor deposition. In particular, use of the material shown in FIG. 2(a) achieves a higher growth speed in chemical vapor deposition compared to when the material shown in FIG. 2(c) is used, while the material shown in FIG. 2(c) is cheaper. These factors provide practical advantages in using such apparatus.

As explained above, a continuous Ru film of 1 nm can be formed using the method of forming Ru film in an embodiment of the present invention, whereas achieving a continuous film with a very small thickness of say, 1 nm or so, has been difficult using conventional methods. The obtained thin Ru film not only has wet chemical resistance, but it also prevents oxygen gas from permeating through it in vacuum and therefore protects the material in the under layer even in a dry atmosphere. When this Ru film is used in fine Cu wiring, the underlying surface is not damaged in atmosphere or vacuum or when exposed to wet chemicals, if a Ru film of 1 nm is formed on top of a barrier metal of WNC, WN, TaN, TaNC, etc., used to prevent copper diffusion. This improves the repeatability and stability of processes that are sensitive to the surface condition, such as the CMP process (chemical mechanical polishing), which contributes to the formation of fine wiring.

If a Ru film or $RuO_2$ film is formed as an electrode, on the other hand, a Ru film can be formed on the surface of the underlying contact metal according to an embodiment of the present invention, after which an appropriate process can be implemented in an oxidizing atmosphere to form a Ru film or Ru/RuOx film without oxidizing the surface of the TiN film, polycrystal silicon, etc., constituting the underlying contact wiring. In other words, the embodiments of the present invention solve the problem of oxidization associated with conventional methods, and can be applied to Ru films very effectively.

The present invention includes the above mentioned embodiments and other various embodiments including the following:

1) A method of forming Ru film and a Ru film formed by said method, characterized by, in the case of a method of forming Ru film, comprising a step to supply onto a substrate a Ru material gas having a Ru(XaXb) molecular structure wherein at least one of Xa or Xb is a non-cyclic pentadienyl, and a step to treat the substrate using a reducing gas excited by high-frequency waves.

2) A method of forming Ru film and a Ru film formed by said method according to 1) above, characterized in that the Ru film is formed to a thickness of no less than 0.5 nm but no more than 2.0 nm, or preferably no less than 0.7 nm but no more than 1.2 nm, by repeating a step to supply the Ru material gas to a substrate and a step to treat the substrate using a reducing gas excited by high-frequency waves.

3) A method of forming thin Ru film and a Ru film formed by said method according to 1) or 2) above, characterized in that the Ru film is formed on a metal film.

4) A method of forming thin Ru film and a Ru film formed by said method according to 3) above, characterized in that the metal film is made of WNC, WN, TaN, Ta, TaNC, TiN, Ti, Cu, Al, Co or Ni.

5) A method of forming thin Ru film and a Ru film formed by said method according to any one of 1) to 4) above, characterized in that the reducing gas is NH3, H2, or a mixture of N2 and H2.

6) A method of forming Ru film and a Ru film formed by said method according to 1) above, characterized in that the first Ru film is formed by repeating a step to supply the Ru material gas to a substrate and a step to treat the substrate using a gas containing at least NH3 or H2 that has been excited by high-frequency waves, for no less than 50 cycles but no more than 150 cycles, or preferably no less than 75 cycles but no more than 100 cycles.

7) A method of forming Ru film and a Ru film formed by said method according to any one of 1) to 6) above, characterized in that the Ru material gas is supplied simultaneously with a different Ru material gas.

8) A method of forming Ru film and a Ru film formed by said method according to any one of 1) to 6) above, characterized in that a step to supply the Ru material gas is repeated for a specified number of times, and then a step to supply a different Ru material gas is repeated for a specified number of times.

9) A method of forming Ru film and a Ru film formed by said method according to any one of 1) to 8) above, characterized in that the pentadienyl group has a side chain with a carbon number of 1 or above bonded to it.

10) A method of forming Ru film and a Ru film formed by said method according to any one of 1) to 9) above, characterized in that either a Ru film or Ru oxide film is layered on top of the Ru film by means of chemical vapor deposition using a desired Ru material and oxygen gas.

11) A method of forming Ru film and a Ru film formed by said method according to any one of 1) to 10) above, characterized in that a copper film is formed on the Ru film.

12) A method of forming Ru film and a Ru film formed by said method according to 11) above, characterized in that a copper film is formed on the Ru film by means of a chemical vapor deposition or atomic layer deposition method, by supplying a copper material molecule into vacuum in gaseous form.

It will be understood by those of skill in the art that numerous and various modifications can be made without departing from the spirit of the present invention.

Therefore, it should be clearly understood that the forms of the present invention are illustrative only and are not intended to limit the scope of the present invention.

What is claimed is:

1. A ruthenium thin film-formed structure comprising:
a substrate;
a ruthenium thin film formed on the substrate, which ruthenium thin film has a thickness of no less than 0.5 nm but no more than 2.0 nm and is continuous with substantially no pinholes in the entirety of said film, said ruthenium thin film being formed by atomic layer deposition using a ruthenium complex containing a non-cyclic dienyl.

2. The ruthenium thin film-formed structure according to claim 1, wherein the substrate has a metal film, and the ruthenium thin film is formed on the metal film.

3. The ruthenium thin film-formed structure according to claim 2, wherein the metal film is selected from the group consisting of WNC, WN, TaN, Ta, TaNC, TIN, Ti, Cu, Al, Go, and Ni.

4. The ruthenium thin film-formed structure according to claim 1, further comprising a copper film on the ruthenium thin film.

5. The ruthenium thin film-formed structure according to claim 4, wherein the copper film is formed by CVD or plating.

6. The ruthenium thin film-formed structure according to claim 1, wherein the substrate has a surface including trenches and vias, and the ruthenium thin film is formed on the surface.

7. The ruthenium thin film-formed structure according to claim 3, further comprising a copper film formed in contact with and on the ruthenium thin film.

8. The ruthenium thin film-formed structure according to claim 1, wherein the ruthenium complex has a structure of Xa-Ru-Xb, wherein at least one of Xa or Xb is a non-cyclic dienyl.

9. The ruthenium thin film-formed structure according to claim 8, wherein the non-cyclic dienyl is a non-cyclic pentadienyl.

10. The ruthenium thin film-formed structure according to claim 9, wherein the non-cyclic pentadienyl has at least one side chain of C1-2 alkyl.

11. The ruthenium thin film-formed structure according to claim 10, wherein the non-cyclic pentadienyl has two side chains of methyl.

* * * * *

UNITED STATES PATENT AND TRADEMARK OFFICE
CERTIFICATE OF CORRECTION

| | |
|---|---|
| PATENT NO. | : 7,435,484 B2 |
| APPLICATION NO. | : 11/469828 |
| DATED | : October 14, 2008 |
| INVENTOR(S) | : Hiroshi Shinriki and Hiroaki Inoue |

Page 1 of 1

It is certified that error appears in the above-identified patent and that said Letters Patent is hereby corrected as shown below:

Column 22/line 21; In Claim 3, change "TIN," to --TiN,--.

Column 22/line 21; In Claim 3, change "Go" to --Co--.

Signed and Sealed this

Nineteenth Day of May, 2009

JOHN DOLL
*Acting Director of the United States Patent and Trademark Office*